(12) United States Patent
Tsutsumi et al.

(10) Patent No.: US 10,804,327 B2
(45) Date of Patent: Oct. 13, 2020

(54) ORGANIC PHOTOELECTRIC DEVICE AND IMAGE SENSOR AND ELECTRONIC DEVICE

(71) Applicant: Samsung Electronics Co., Ltd., Suwon-si, Gyeonggi-do (KR)

(72) Inventors: Kiyohiko Tsutsumi, Suwon-si (KR); Kyung Bae Park, Hwaseong-si (KR); Takkyun Ro, Hwaseong-si (KR); Chul Joon Heo, Busan (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 95 days.

(21) Appl. No.: 16/136,584

(22) Filed: Sep. 20, 2018

(65) Prior Publication Data

US 2019/0172872 A1 Jun. 6, 2019

(30) Foreign Application Priority Data

Dec. 1, 2017 (KR) .................. 10-2017-0164148

(51) Int. Cl.

| | | |
|---|---|---|
| *H01B 1/12* | (2006.01) | |
| *H01L 27/30* | (2006.01) | |
| *H01L 51/44* | (2006.01) | |
| *H01L 51/42* | (2006.01) | |
| *H01L 27/146* | (2006.01) | |
| *H01L 51/00* | (2006.01) | |

(52) U.S. Cl.
CPC .............. *H01L 27/307* (2013.01); *H01B 1/12* (2013.01); *H01L 27/14621* (2013.01);
(Continued)

(58) Field of Classification Search
CPC ......... H01L 2251/308; H01L 2251/556; H01L 27/14621; H01L 27/14645;
(Continued)

(56) References Cited

U.S. PATENT DOCUMENTS

| | | |
|---|---|---|
| 8,525,577 B2 | 9/2013 | Yofu et al. |
| 10,381,413 B2 * | 8/2019 | Yun ..................... H01L 51/4253 |

(Continued)

FOREIGN PATENT DOCUMENTS

| | | |
|---|---|---|
| JP | 2013/012535 A | 1/2013 |
| KR | 2017/0126753 A | 11/2017 |
| KR | 2017/0137648 A | 12/2017 |

OTHER PUBLICATIONS

Hokuto Seo et al. "Color Sensors with Three Vertically Stacked Organic Photodetectors". Japanese Journal of Applied Physics, vol. 46, No. 49. The Japan Society of Applied Physics. 2007. pp. L1240-L1242.

(Continued)

*Primary Examiner* — Mark Kopec
*Assistant Examiner* — Jaison P Thomas
(74) *Attorney, Agent, or Firm* — Harness, Dickey & Pierce, P.L.C.

(57) ABSTRACT

Disclosed are an organic photoelectric device including a first electrode and a second electrode facing each other and a photoelectric conversion layer disposed between the first electrode and the second electrode and selectively absorbing light in a green wavelength region, wherein the photoelectric conversion layer includes a first and second photoelectric conversion materials, a light-absorption full width at half maximum (FWHM) in a green wavelength region of the first photoelectric conversion material is narrower than the light-absorption FWHM in a green wavelength region of the second photoelectric conversion material, and the first and second photoelectric conversion materials satisfy Relationship Equation 1, and an image sensor and an electronic device including the same.

$Tm_2(° C.) - Ts_{2(10)}(° C.) \geq Tm_1(° C.) - Ts_{1(10)}(° C.)$  [Relationship Equation 1]

20 Claims, 12 Drawing Sheets

(52) U.S. Cl.
CPC .. *H01L 27/14645* (2013.01); *H01L 27/14667* (2013.01); *H01L 51/0052* (2013.01); *H01L 51/0061* (2013.01); *H01L 51/0069* (2013.01); *H01L 51/0071* (2013.01); *H01L 51/4253* (2013.01); *H01L 51/441* (2013.01); *H01L 51/001* (2013.01); *H01L 51/0046* (2013.01); *H01L 51/0072* (2013.01); *H01L 51/0074* (2013.01); *H01L 2251/308* (2013.01); *H01L 2251/556* (2013.01)

(58) Field of Classification Search
CPC ............ H01L 27/14667; H01L 27/307; H01L 51/001; H01L 51/0046; H01L 51/0052; H01L 51/0061; H01L 51/0069; H01L 51/0071; H01L 51/0072; H01L 51/0074; H01L 51/4253; H01L 51/441; H01B 1/12
See application file for complete search history.

(56) References Cited

U.S. PATENT DOCUMENTS

| | | | |
|---|---|---|---|
| 2007/0012955 A1* | 1/2007 | Ihama | H01L 27/14621 257/233 |
| 2014/0117321 A1* | 5/2014 | Lim | C07C 13/62 257/40 |
| 2016/0126470 A1* | 5/2016 | Ro | H01L 51/0053 257/40 |
| 2016/0149132 A1* | 5/2016 | Lim | H01L 51/006 257/40 |
| 2016/0181547 A1* | 6/2016 | Han | C09B 23/04 257/40 |
| 2016/0211465 A1* | 7/2016 | Tadao | H01L 51/0071 |
| 2017/0331050 A1 | 11/2017 | Yagi et al. | |
| 2017/0352811 A1 | 12/2017 | Choi et al. | |

OTHER PUBLICATIONS

Satoshi Aihara et al. "Stacked Image Sensor with Green- and Red-Sensitive Organic Photoconductive Films Applying Zinc Oxide Thin-Film Transistors to a Signal Readout Circuit".. IEEE Transactions on Electron Devices, vol. 56, No. 11. Nov. 2009. pp. 2570-2576.

Mikio Ihama et al. "CMOS Image Sensor with a Thin Overlaid Panchromatic Organic Photoconductive Layer for Sensors with Reduced Pixel Size". IDW: INP1-4. 2009. pp. 2123-2126.

* cited by examiner

ORGANIC PHOTOELECTRIC DEVICE AND IMAGE SENSOR AND ELECTRONIC DEVICE

CROSS-REFERENCE TO RELATED APPLICATION

This application claims priority to and the benefit of Korean Patent Application No. 10-2017-0164148 filed in the Korean Intellectual Property Office on Dec. 1, 2017, the entire contents of which are incorporated herein by reference.

BACKGROUND

1. Field

An organic photoelectric device, an image sensor, and an electronic device are disclosed.

2. Description of the Related Art

A photoelectric device converts light into an electrical signal using photoelectric effects, it may include a photodiode, a phototransistor, and the like, and it may be applied to an image sensor, a solar cell, an organic light emitting diode, and the like.

An image sensor including a photodiode requires high resolution and thus a small pixel. At present, a silicon photodiode is widely used, but it has a problem of deteriorated sensitivity since it has a small absorption area due to small pixels.

Accordingly, an organic material that is capable of replacing silicon has been researched. An organic material has a high extinction coefficient and selectively absorbs light in a particular wavelength region depending on a molecular structure, and thus may simultaneously replace a photodiode and a color filter and resultantly improve sensitivity and contribute to higher integration.

However, since the organic material exhibits different characteristics from those of silicon due to higher binding energy and a recombination behavior, the characteristics of the organic material are difficult to precisely predict, and thus required properties of a photoelectric device may not be easily controlled.

SUMMARY

Example embodiments provide an organic photoelectric device capable of improving optical properties and heat resistance.

Example embodiments provide an image sensor including the organic photoelectric device.

Example embodiments provide an electronic device an electronic device including the image sensor.

According to example embodiments, an organic photoelectric device includes a first electrode and a second electrode facing each other and a photoelectric conversion layer disposed between the first electrode and the second electrode and selectively absorbing light in a green wavelength region, wherein the photoelectric conversion layer includes first and second photoelectric conversion materials, a light-absorption full width at half maximum (FWHM) in a green wavelength region of the first photoelectric conversion material is narrower than the light-absorption FWHM in a green wavelength region of the second photoelectric conversion material, and the first and second photoelectric conversion materials satisfy Relationship Equation 1.

$$Tm_2(°C.) - Ts_{2(10)}(°C.) \geq Tm_1(°C.) - Ts_{1(10)}(°C.) \quad \text{[Relationship Equation 1]}$$

In Relationship Equation 1, $T_{m1}$ is a melting point of the first photoelectric conversion material, $T_{m2}$ is a melting point of the second photoelectric conversion material, $T_{s1(10)}$ is a temperature where 10 wt % weight loss occurs due to sublimation of the first photoelectric conversion material at 10 Pa, and $T_{s2(10)}$ is a temperature where 10 wt % weight loss occurs due to sublimation of the second photoelectric conversion material at 10 Pa.

The second photoelectric conversion material may satisfy Relationship Equation 1a.

$$Tm_2(°C.) - Ts_{2(10)}(°C.) \geq 75°C. \quad \text{[Relationship Equation 1a]}$$

In Relationship Equation 1a, $T_{m2}$ is a melting point of the second photoelectric conversion material, and $T_{s2(10)}$ is a temperature where 10 wt % weight loss occurs due to sublimation of the second photoelectric conversion material at 10 Pa.

The first photoelectric conversion material may satisfy Relationship Equation 1b.

$$Tm_1(°C.) - Ts_{1(10)}(°C.) < 75°C. \quad \text{[Relationship Equation 1b]}$$

In Relationship Equation 1b, $T_{m1}$ is a melting point of the first photoelectric conversion material, and $T_{s1(10)}$ is a temperature where 10 wt % weight loss occurs due to sublimation of the first photoelectric conversion material at 10 Pa.

The first and second photoelectric conversion materials may satisfy Relationship Equation 2.

$$Tm_2(°C.) - Ts_{2(50)}(°C.) \geq Tm_1(°C.) - Ts_{1(50)}(°C.) \quad \text{[Relationship Equation 2]}$$

In Relationship Equation 2, $T_{m1}$ is a melting point of the first photoelectric conversion material, $T_{m2}$ is a melting point of the second photoelectric conversion material, $T_{s1(50)}$ is a temperature where 50 wt % weight loss occurs due to sublimation of the first photoelectric conversion material at 10 Pa, and $T_{s2(50)}$ is a temperature where 50 wt % weight loss occurs due to sublimation of the second photoelectric conversion material at 10 Pa.

The second photoelectric conversion material may satisfy Relationship Equation 2a.

$$Tm_2(°C.) - Ts_{2(50)}(°C.) \geq 48°C. \quad \text{[Relationship Equation 2a]}$$

In Relationship Equation 2a, $T_{m2}$ is a melting point of the second photoelectric conversion material, and $T_{s2(50)}$ is a temperature where 50 wt % weight loss occurs due to sublimation of the second photoelectric conversion material at 10 Pa.

The first photoelectric conversion material may satisfy Relationship Equation 2b.

$$Tm_1(°C.) - Ts_{1(50)}(°C.) \leq 45°C. \quad \text{[Relationship Equation 2b]}$$

In Relationship Equation 2b, $T_{m1}$ is a melting point of the first photoelectric conversion material, and $T_{s1(50)}$ is a temperature where 50 wt % weight loss occurs due to sublimation of the first photoelectric conversion material at 10 Pa.

The light-absorption full width at half maximum (FWHM) in a green wavelength region of the first photoelectric conversion material may be less than or equal to about 110 nm.

External quantum efficiency in a 450 nm wavelength of the first photoelectric conversion material may be lower than external quantum efficiency in a 450 nm wavelength of the second photoelectric conversion material.

The first and second photoelectric conversion materials may have each peak absorption wavelength (λmax) in a region of about 530 nm to about 570 nm.

The first and second photoelectric conversion materials may independently be represented by Chemical Formula 1.

EDG-HA-EAG    [Chemical Formula 1]

In Chemical Formula 1,

HA is a C2 to C30 heterocyclic group including at least one of S, Se, Te, and Si, EDG is an electron donating group, and EAG is an electron accepting group.

The second photoelectric conversion material may be represented by Chemical Formula 1b.

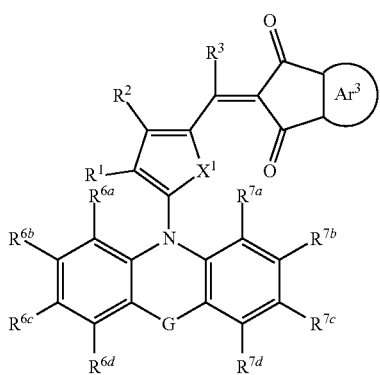

[Chemical Formula 1b]

In Chemical Formula 1b, $X^1$ is Se, Te, O, S, SO, or $SO_2$, $Ar^3$ is a substituted or unsubstituted C6 to C30 arylene group, a substituted or unsubstituted C3 to C30 heterocyclic group, or a fused ring of the foregoing two or more, $R^1$ to $R^3$ are independently one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, and a combination thereof, G is one of a single bond, —O—, —S—, —Se—, —N═, —$(CR^fR^g)_k$—, —$NR^h$—, —$SiR^iR^j$—, —$GeR^kR^l$—, —$C(R^m)$═$C(R^n)$—, and $SnR^oR^p$, wherein $R^f$, $R^g$, $R^h$, $R^i$, $R^j$, $R^k$, $R^l$, $R^m$, $R^n$, $R^o$, and $R^p$ are independently one of hydrogen, a halogen, a substituted or unsubstituted C1 to C10 alkyl group, a substituted or unsubstituted C1 to C10 alkoxy group, and a substituted or unsubstituted C6 to C12 aryl group, $R^f$ and $R^g$, $R^i$ and $R^j$, $R^k$ and $R^l$, $R^m$ and $R^n$, and $R^o$ and $R^p$ are independently present alone or linked with each other to provide a ring, and k is 1 or 2, $R^{6a}$ to $R^{6d}$ and $R^{7a}$ to $R^{7d}$ are independently one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, and a combination thereof, $R^{6a}$ to $R^{6d}$ are independently present alone or adjacent two thereof are linked with each other to form a fused ring, and $R^{7a}$ to $R^{7d}$ are independently present alone or adjacent two thereof are linked with each other to form a fused ring.

$Ar^3$ of Chemical Formula 1b may be benzene, naphthylene, anthracene, thiophene, selenophene, tellurophene, pyridine, pyrimidine, or a fused ring of the foregoing two or more.

The first and second photoelectric conversion materials may be included in a weight ratio of about 50:50 to about 95:5.

The photoelectric conversion layer may include at least one p-type semiconductor and at least one n-type semiconductor that form a pn junction and each of the first and second photoelectric conversion materials may be the p-type semiconductor.

The n-type semiconductor may include fullerene or a fullerene derivative.

According to example embodiments, an image sensor includes the organic photoelectric device.

The image sensor may further include a semiconductor substrate disposed under the organic photoelectric device and the semiconductor substrate may include a first photo-sensing device configured to sense light in a red wavelength region and a second photo-sensing device configured to sense light in a blue wavelength region.

The image sensor may further include the organic photoelectric device and may include a first organic photoelectric device configured to sense light in a green wavelength region, a second organic photoelectric device configured to sense light in a red wavelength region, and a third organic photoelectric device configured to sense light in a blue wavelength region.

According to example embodiments, an electronic device includes the organic photoelectric device.

According to example embodiments, an electronic device includes the image sensor.

Optical properties and thermal stability of the organic photoelectric device and the image sensor may be satisfactory.

DETAILED DESCRIPTION

Figure 1:
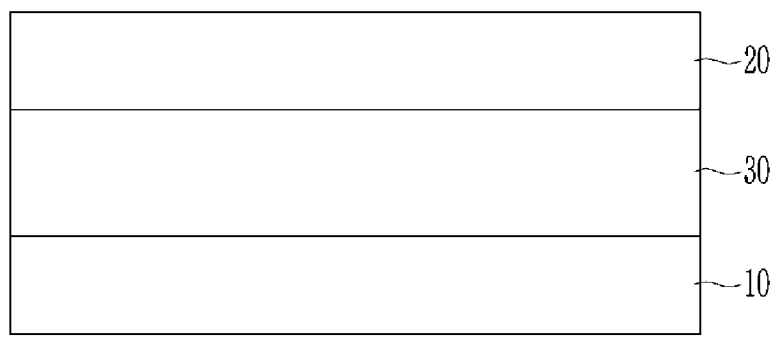
FIG. 1 is a cross-sectional view showing an organic photoelectric device according to an example embodiment.

Hereinafter, example embodiments of the present disclosure will be described in detail so that a person skilled in the art would understand the same.

This disclosure may, however, be embodied in many different forms and is not construed as limited to the example embodiments set forth herein.

In the drawings, the thickness of layers, films, panels, regions, etc., are exaggerated for clarity.

Like reference numerals designate like elements throughout the specification.

It will be understood that when an element such as a layer, film, region, or substrate is referred to as being "on" another element, it can be directly on the other element or intervening elements may also be present.

In contrast, when an element is referred to as being "directly on" another element, there are no intervening elements present.

In the drawings, parts having no relationship with the description are omitted for clarity of the example embodiments, and the same or similar constituent elements are indicated by the same reference numeral throughout the specification.

Hereinafter, 'combination' refers to a mixture of two or more and a stack structure of two or more.

As used herein, when a definition is not otherwise provided, "substituted" refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to inclusion of one to three heteroatoms selected from O, S, P, and Si.

Hereinafter, a HOMO energy level is expressed as an absolute value from a vacuum level.

In addition, when the HOMO energy level is said to be "deep," "high," or "large," the HOMO energy level has a large absolute value based on "0 eV" of the vacuum level, while when the HOMO energy level is "shallow," "low," or "small," the HOMO energy level has a small absolute value based on "0 eV" of the vacuum level.

Hereinafter, as used herein, when a definition is not otherwise provided, each characteristic is measured in state of a thin film (deposition thin film).

Hereinafter, an organic photoelectric device according to example embodiments is described with reference to the drawings.

FIG. 1 is a cross-sectional view showing an organic photoelectric device according to an example embodiment.

Referring to FIG. 1, an organic photoelectric device 100 according to an example embodiment includes a first electrode 10 and a second electrode 20 facing each other and/or a photoelectric conversion layer 30 between the first electrode 10 and the second electrode 20.

A substrate (not shown) may be disposed on a surface of the first electrode 10 or a surface of the second electrode 20.

The substrate may be for example made of an inorganic material such as glass, an organic material such as polycarbonate, polymethylmethacrylate, polyethyleneterephthalate, polyethylenenaphthalate, polyamide, polyethersulfone, or a combination thereof, or a silicon wafer.

One of the first electrode 10 and the second electrode 20 may be an anode and the other may be a cathode.

For example, the first electrode 10 may be an anode and the second electrode 20 may be a cathode.

At least one of the first electrode 10 and the second electrode 20 may be a light-transmitting electrode and the light-transmitting electrode may be for example made of a conductive oxide such as an indium tin oxide (ITO), indium zinc oxide (IZO), zinc oxide (ZnO), tin oxide (SnO), aluminum tin oxide (AlTO), and fluorine doped tin oxide (FTO), or a metal thin layer of a single layer or a multilayer. p When one of the first electrode 10 and the second electrode 20 is a non-light-transmitting electrode, it may be made of for example an opaque conductor such as aluminum (Al), silver (Ag), or gold (Au).

For example, the first electrode 10 and the second electrode 20 may both be all light-transmitting electrodes.

For example, the second electrode 20 may be a light receiving electrode disposed at a light receiving side.

The photoelectric conversion layer 30 may selectively absorb light of at least one part of a wavelength region of a visible ray wavelength region, for example, light of a green wavelength region (hereinafter, referred to as 'green light'), light of a blue wavelength region (hereinafter, referred to as 'blue light'), and light of a red wavelength region (hereinafter, referred to as 'red light').

For example, the photoelectric conversion layer 30 may selectively absorb one of the green light, the blue light, and the red light.

Herein, the selective absorption of one of the green light, the blue light, and the red light means that an absorption spectrum thereof has a peak absorption wavelength ($\lambda$max) in one range among the ranges of about 500 about to 600 nm, greater than or equal to about 380 nm and less than about 500 nm, and greater than about 600 nm and less than or equal to about 700 nm and is remarkably higher in a corresponding wavelength region than in the other wavelength regions.

For example, the photoelectric conversion layer 30 may selectively absorb green light.

For example, the photoelectric conversion layer 30 may be a thin film obtained by deposition under a vacuum condition or a low pressure condition similar to the vacuum condition.

The photoelectric conversion layer 30 is a layer including at least one p-type semiconductor and at least one n-type semiconductor to provide a pn junction, which is a layer producing excitons by receiving light from outside and then separating holes and electrons from the produced excitons.

For example, the photoelectric conversion layer 30 may include at least two p-type semiconductors and may include for example first and second photoelectric conversion materials as the p-type semiconductor.

The first and second photoelectric conversion materials may have peak absorption wavelengths ($\lambda$max1, $\lambda$max2) in each green wavelength region, for example in each wavelength region of about 530 nm to about 570 nm, or in each wavelength region of about 535 nm to about 565 nm.

The first and second photoelectric conversion materials may have the same or different peak absorption wavelength ($\lambda$max1, $\lambda$max2).

The first and second photoelectric conversion materials may have each light-absorption full width at half maximum (FWHM) in each center of each peak absorption wavelength ($\lambda$max1, $\lambda$max2) in a green wavelength region, and for example the light-absorption full width at half maximum (FWHM) of the first photoelectric conversion material may be narrower than the light-absorption full width at half maximum (FWHM) of the second photoelectric conversion material.

Herein, the light-absorption full width at half maximum (FWHM) is a width of a wavelength corresponding to a half of a peak absorption point and may be defined with a reference to an absorbance measured with a UV-Vis spectroscope meter, unless specific definition is otherwise provided.

When the light-absorption FWHM is narrow, light in a narrow wavelength region is selectively absorbed, which means that wavelength selectivity is high.

The first photoelectric conversion material may have for example light-absorption FWHM of less than or equal to about 110 nm.

The first photoelectric conversion material may have for example light-absorption FWHM of about 50 nm to about 110 nm, for example about 60 nm to about 110 nm, about 70 nm to about 110 nm, about 70 nm to about 105 nm, or about 70 nm to about 100 nm.

The light-absorption FWHM of the second photoelectric conversion material may be wider than the light-absorption FWHM of the first photoelectric conversion material, and may be for example a light-absorption FWHM of less than or equal to about 150 nm.

The second photoelectric conversion material may have a light-absorption FWHM of for example about 80 nm to about 150 nm, for example about 85 nm to about 150 nm, about 90 nm to about 150 nm, about 90 nm to about 140 nm, or about 90 nm to about 130 nm.

The first and second photoelectric conversion materials may have each predetermined or alternatively, desired extinction coefficient in each peak absorption wavelength ($\lambda$max1, $\lambda$max2) and for example the extinction coefficient of the first photoelectric conversion material may be larger than the extinction coefficient of the second photoelectric conversion material.

The first photoelectric conversion material may have for example an extinction coefficient of greater than or equal to about $6.5 \times 10^4$ cm-1, greater than or equal to about $6.6 \times 10^4$ cm-1, about $6.5 \times 10^4$ cm-1 to about $1.5 \times 10^5$ cm-1, about $6.6 \times 10^4$ cm-1 to about $1.5 \times 10^5$ cm-1, about $6.6 \times 10^4$ cm-1 to about $1.2 \times 10^5$ cm-1, or about $6.6 \times 10^4$ cm-1 to about $1.0 \times 10^5$ cm-1.

The first and second photoelectric conversion materials may have for example each HOMO energy level of about 5.30 eV to about 5.80 eV.

It may have for example each HOMO energy level of about 5.35 eV to about 5.76 eV or about 5.39 eV to about 5.76 eV.

When the first and second photoelectric conversion materials have HOMO energy levels within the ranges, they may have good electrical characteristics.

The first and second photoelectric conversion materials may have an energy bandgap ranging from about 1.7 eV to about 2.3 eV.

Within the range, the first and second photoelectric conversion materials may have, for example, an energy bandgap ranging from about 1.8 to about 2.2 eV, and within the range, for example, from about 1.9 to about 2.1 eV.

When the first and second photoelectric conversion materials have an energy bandgap within the range, they may have high external quantum efficiency (EQE) at each peak absorption wavelength ($\lambda$max1, $\lambda$max2) and thus improve photoelectric conversion efficiency.

For example, the external quantum efficiency (EQE) at the peak absorption wavelength ($\lambda$max1) of the first photoelectric conversion material may be higher than the external quantum efficiency (EQE) at the peak absorption wavelength ($\lambda$max2) of the second photoelectric conversion material.

For example, the external quantum efficiency (EQE) at the peak absorption wavelength ($\lambda$max1) of the first photoelectric conversion material may be greater than or equal to about 60%, greater than or equal to about 62%, greater than or equal to about 65%, greater than or equal to about 66%, or greater than or equal to about 67%.

For example, the external quantum efficiency (EQE) in a blue wavelength region of the first photoelectric conversion material may be lower than the external quantum efficiency (EQE) in a blue wavelength region of the second photoelectric conversion material.

For example, the external quantum efficiency (EQE) at a 450 nm wavelength of the first photoelectric conversion material may be lower than the external quantum efficiency (EQE) at a 450 nm wavelength of the second photoelectric conversion material.

For example, the external quantum efficiency (EQE) at a 450 nm wavelength of the first photoelectric conversion material may be less than or equal to about 25%, less than or equal to about 22%, less than or equal to about 20%, or less than or equal to about 19%.

For example, the external quantum efficiency (EQE) at a 450 nm wavelength of the second photoelectric conversion material may be less than or equal to about 40%, about 20% to about 40%, about 22% to about 38%, or about 25% to about 35%.

In this way, the external quantum efficiency (EQE) at the peak absorption wavelength ($\lambda$max1) of the first photoelectric conversion material may be larger than the external quantum efficiency (EQE) at the peak absorption wavelength ($\lambda$max2) of the second photoelectric conversion material and the external quantum efficiency (EQE) at a 450 nm wavelength of the first photoelectric conversion material is smaller than the external quantum efficiency (EQE) at a 450 nm wavelength of the second photoelectric conversion material, and thereby a ration of the external quantum efficiency (EQE) in a green wavelength region relative to the external quantum efficiency (EQE) in a blue wavelength region of the first photoelectric conversion material is increased and thus wavelength selectivity may be higher.

For example, ratios of the external quantum efficiency (EQE) at each peak absorption wavelength ($\lambda_{max1}$, $\lambda_{max2}$) and the external quantum efficiency (EQE) at a 450 nm wavelength of the first and second photoelectric conversion materials may satisfy Relationship Equation A.

$$EQE(2)_{\lambda max2}/EQE(2)_{450\ nm} < EQE(1)_{\lambda max1}/EQE(1)_{450\ nm} \quad \text{[Relationship Equation A]}$$

In Relationship Equation A, $EQE(2)_{\lambda max2}$ is external quantum efficiency (EQE) at the peak absorption wavelength ($\lambda_{max2}$) of the second photoelectric conversion material, $EQE(2)_{450\ nm}$ is external quantum efficiency (EQE) at 450 nm of the second photoelectric conversion material, $EQE(1)_{\lambda max1}$ is external quantum efficiency (EQE) at the peak absorption wavelength ($\lambda_{max1}$) of the first photoelectric conversion material, and $EQE(1)_{450\ nm}$ is external quantum efficiency (EQE) at 450 nm of the first photoelectric conversion material.

The second photoelectric conversion material may have a relatively high melting point (Tm) and thus may provide a photoelectric conversion layer having a good quality by codeposition with the first photoelectric conversion material.

A deposition method may provide formation of a uniform thin film and have a little impurity mixing, but when a melting point of a compound is lower than a deposition temperature, a decomposed product of the compound may be deposited as impurities and may inhibit performance of an organic photoelectric device.

For example, the second photoelectric conversion material may have a melting point (Tm) of about 310° C. to about 370° C.

For example, the melting point (Tm) of the second photoelectric conversion material may be higher than a deposition temperature and for example the melting point (Tm) of the second photoelectric conversion material may be higher than the deposition temperature by greater than or equal to about 10° C.

Illustrated in more detail, the first photoelectric conversion material satisfying the optical properties may have good optical properties but may be easily thermally decomposed during deposition due to unsatisfactory heat resistance.

When this photoelectric conversion material having weak thermal characteristics is used alone, the compound may be thermally decomposed during deposition and thus the performance of the device may be decreased, and when exposed to a relatively high temperature (about 160° C.) in a subsequent process such as a micro lens array (MLA), the compound may be decomposed again to further decrease device performance and cause a morphology change of the photoelectric conversion layer.

The second photoelectric conversion material is included with the first photoelectric conversion material and thereby thermal stability of the photoelectric conversion layer may be increased.

For example, the first and second photoelectric conversion materials may be codeposited under a vacuum or a low pressure similar thereto, and may be for example deposited by sublimation.

The vacuum deposition by sublimation may be confirmed by thermogravimetric analysis (TGA) and a sublimation temperature may be confirmed by a ratio of a weight loss of a sample.

For example, Ts(10), Ts(20), Ts(30), and Ts(50) may be defined as temperature at which about 10 wt %, about 20 wt %, about 30 wt %, and about 50 wt % of weight losses of each sample by sublimation under a predetermined or alternatively, desired pressure occur.

The second photoelectric conversion material may have higher thermal stability during sublimation than the first photoelectric conversion material.

For example, the first and second photoelectric conversion materials may satisfy Relationship Equation 1.

$$Tm_2(°C.) - Ts_{2(10)}(°C.) \geq Tm_1(°C.) - Ts_{1(10)}(°C.) \quad \text{[Relationship Equation 1]}$$

In Relationship Equation 1, $T_{m1}$ is a melting point of the first photoelectric conversion material, $T_{m2}$ is a melting point of the second photoelectric conversion material, $T_{s1(10)}$ is a temperature where 10 wt % weight loss occurs due to sublimation of the first photoelectric conversion material at 10 Pa, and $Ts_{2(10)}$ is a melting point of the second photoelectric conversion material.

For example, the second photoelectric conversion material may satisfy Relationship Equation 1a.

$$Tm_2(°C.) - Ts_{2(10)}(°C.) \geq 75°C. \quad \text{[Relationship Equation 1a]}$$

For example, the second photoelectric conversion material may satisfy Relationship Equation 1 a-1.

$$75°C. \leq Tm_2(°C.) - Ts_{2(10)}(°C.) \leq 150°C. \quad \text{[Relationship Equation 1a-1]}$$

For example, the second photoelectric conversion material may satisfy Relationship Equation 1a-2.

$$75°C. \leq Tm_2(°C.) - Ts_{2(10)}(°C.) \leq 130°C. \quad \text{[Relationship Equation 1a-2]}$$

For example, the second photoelectric conversion material may satisfy Relationship Equation 1a-3.

$$75°C. \leq Tm_2(°C.) - Ts_{2(10)}(°C.) \leq 120°C. \quad \text{[Relationship Equation 1a-3]}$$

For example, the second photoelectric conversion material may satisfy Relationship Equation 1a-4.

$$78°C. \leq Tm_2(°C.) - Ts_{2(10)}(°C.) \leq 150°C. \quad \text{[Relationship Equation 1a-4]}$$

For example, the second photoelectric conversion material may satisfy Relationship Equation 1a-5.

$$78°C. \leq Tm_2(°C.) - Ts_{2(10)}(°C.) \leq 130°C. \quad \text{[Relationship Equation 1a-5]}$$

For example, the second photoelectric conversion material may satisfy Relationship Equation 1a-6.

$$78°C. \leq Tm_2(°C.) - Ts_{2(10)}(°C.) \leq 120°C. \quad \text{[Relationship Equation 1a-6]}$$

For example, the second photoelectric conversion material may satisfy Relationship Equation 1a-7.

$$80°C. \leq Tm_2(°C.) - Ts_{2(10)}(°C.) \leq 150°C. \quad \text{[Relationship Equation 1a-7]}$$

For example, the second photoelectric conversion material may satisfy Relationship Equation 1a-8.

$$80°C. \leq Tm_2(°C.) - Ts_{2(10)}(°C.) \leq 130°C. \quad \text{[Relationship Equation 1a-8]}$$

For example, the second photoelectric conversion material may satisfy Relationship Equation 1a-9.

$$80°C. \leq Tm_2(°C.) - T_{s2(10)}(°C.) \leq 120°C. \quad \text{[Relationship Equation 1a-9]}$$

For example, the first photoelectric conversion material may satisfy Relationship Equation 1b.

$$Tm_1(° C.) - Ts_{1(10)}(° C.) < 75° C. \quad \text{[Relationship Equation 1b]}$$

For example, the first photoelectric conversion material may satisfy Relationship Equation 1b-1.

$$0° C. < Tm_1(° C.) - Ts_{1(10)}(° C.) < 75° C. \quad \text{[Relationship Equation 1b-1]}$$

For example, the first photoelectric conversion material may satisfy Relationship Equation 1b-2.

$$2° C. \leq Tm_1(° C.) - Ts_{1(10)}(° C.) \leq 70° C. \quad \text{[Relationship Equation 1b-2]}$$

For example, the first photoelectric conversion material may satisfy Relationship Equation 1b-3.

$$5° C. \leq Tm_1(° C.) - Ts_{1(10)}(° C.) \leq 70° C. \quad \text{[Relationship Equation 1b-3]}$$

For example, the first photoelectric conversion material may satisfy Relationship Equation 1b-4.

$$10° C. \leq Tm_1(° C.) - Ts_{1(10)}(° C.) \leq 70° C. \quad \text{[Relationship Equation 1b-4]}$$

For example, the first photoelectric conversion material may satisfy Relationship Equation 1b-5.

$$15° C. \leq Tm_1(° C.) - Ts_{1(10)}(° C.) \leq 68° C. \quad \text{[Relationship Equation 1b-4]}$$

For example, the first photoelectric conversion material may satisfy Relationship Equation 1b-6.

$$20° C. \leq Tm_1(° C.) - Ts_{1(10)}(° C.) \leq 68° C. \quad \text{[Relationship Equation 1b-4]}$$

For example, the first and second photoelectric conversion materials may satisfy Relationship Equation 2.

$$Tm_2(° C.) - Ts_{2(50)}(° C.) \geq Tm_1(° C.) - Ts_{1(50)}(° C.) \quad \text{[Relationship Equation 2]}$$

In Relationship Equation 2, $T_{m1}$ is a melting point of the first photoelectric conversion material, $T_{m2}$ is a melting point of the second photoelectric conversion material, $T_{s1(50)}$ is a temperature where 50 wt % weight loss occurs due to sublimation of the first photoelectric conversion material at 10 Pa, and $T_{s2(50)}$ is a temperature where 50 wt % weight loss occurs due to sublimation of the second photoelectric conversion material at 10 Pa.

For example, the second photoelectric conversion material may satisfy Relationship Equation 2a.

$$Tm_2(° C.) - Ts_{2(50)}(° C.) \geq 48° C. \quad \text{[Relationship Equation 2a]}$$

For example, the second photoelectric conversion material may satisfy Relationship Equation 2a-1.

$$48° C. \leq Tm_2(° C.) - Ts_{2(50)}(° C.) \leq 100° C. \quad \text{[Relationship Equation 2a-1]}$$

For example, the second photoelectric conversion material may satisfy Relationship Equation 2a-2.

$$48° C. \leq Tm_2(° C.) - Ts_{2(50)}(° C.) \leq 95° C. \quad \text{[Relationship Equation 2a-2]}$$

For example, the second photoelectric conversion material may satisfy Relationship Equation 2a-3.

$$48° C. \leq Tm_2(° C.) - Ts_{2(50)}(° C.) \leq 90° C. \quad \text{[Relationship Equation 2a-3]}$$

For example, the second photoelectric conversion material may satisfy Relationship Equation 2a-4.

$$48° C. \leq Tm_2(° C.) - Ts_{2(50)}(° C.) \leq 85° C. \quad \text{[Relationship Equation 2a-4]}$$

For example, the first photoelectric conversion material may satisfy Relationship Equation 2b.

$$Tm_1(° C.) - Ts_{1(50)}(° C.) \leq 45° C. \quad \text{[Relationship Equation 2b]}$$

For example, the first photoelectric conversion material may satisfy Relationship Equation 2b-1.

$$0° C. \leq Tm_1(° C.) - Ts_{1(50)}(° C.) \leq 45° C. \quad \text{[Relationship Equation 2b-1]}$$

For example, the first photoelectric conversion material may satisfy Relationship Equation 2b-2.

$$5° C. \leq Tm_1(° C.) - Ts_{1(50)}(° C.) \leq 45° C. \quad \text{[Relationship Equation 2b-2]}$$

For example, the first photoelectric conversion material may satisfy Relationship Equation 2b-3.

$$10° C. \leq Tm_1(° C.) - Ts_{1(50)}(° C.) \leq 45° C. \quad \text{[Relationship Equation 2b-3]}$$

For example, the second photoelectric conversion material may satisfy Relationship Equation 3a.

$$\Delta TG_2(T_{s2(50)}) \leq 15\% \quad \text{[Relationship Equation 3a]}$$

In Relationship Equation 3a, $\Delta TG_2$ is a weight loss ratio of a sample after heating it at a temperature of $T_{s2(50)}$ for 8 hours.

For example, the second photoelectric conversion material may satisfy Relationship Equation 3a-1.

$$\Delta TG_2(T_{s2(50)}) \leq 12\% \quad \text{[Relationship Equation 3a-1]}$$

For example, the second photoelectric conversion material may satisfy Relationship Equation 3a-2.

$$\Delta TG_2(T_{s2(50)}) \leq 11\% \quad \text{[Relationship Equation 3a-2]}$$

For example, the first photoelectric conversion material may satisfy Relationship Equation 3b.

$$\Delta TG_1(T_{s1(50)}) \geq 20\% \quad \text{[Relationship Equation 3b]}$$

In Relationship Equation 3b, $\Delta TG_1$ is a weight loss ratio of a sample after heating it at a temperature of $T_{s1(50)}$ for 8 hours.

For example, the first photoelectric conversion material may satisfy Relationship Equation 3b-1.

$$\Delta TG_1(T_{s1(50)}) \geq 23\% \quad \text{[Relationship Equation 3b-1]}$$

For example, the second photoelectric conversion material may satisfy Relationship Equation 3b-2.

$$\Delta TG_1(T_{s1(50)}) \geq 25\% \quad \text{[Relationship Equation 3b-2]}$$

In this way, the photoelectric conversion layer includes the first photoelectric conversion material having good optical properties in a green wavelength region and the second photoelectric conversion material having good thermal stability together, and thereby optical properties and thermal stability may be simultaneously satisfied.

The first and second photoelectric conversion materials have no particular limit, as far as the aforementioned characteristics are satisfied, but may be for example selected from organic compounds simultaneously having an electron donating moiety and an electron accepting moiety.

For example, the first and second photoelectric conversion materials may be independently an organic compound having a structure that the electron donating group and the electron accepting group as a substituent are bonded with a pi-conjugation core having semiconductor characteristics.

For example, the first and second photoelectric conversion materials may independently be for example represented by Chemical Formula 1, but are not limited thereto.

$$EDG-HA-EAG \quad \text{[Chemical Formula 1]}$$

In Chemical Formula 1,

HA is a C2 to C30 heterocyclic group having at least one of Se, Te, S, and Si,

EDG is an electron donating group, and

EAG is an electron accepting group.

For example, the first photoelectric conversion material may be represented by Chemical Formula 1 a, but is not limited thereto.

[Chemical Formula 1a]

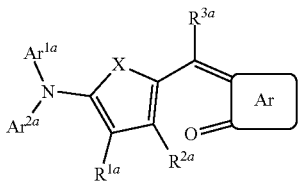

In Chemical Formula 1a,

X is Se, Te, S, SO, $SO_2$, or $SiR^aR^b$,

Ar is a substituted or unsubstituted C6 to C30 arylene group, a substituted or unsubstituted C3 to C30 heterocyclic group, or a fused ring of the foregoing two or more, $Ar^{1a}$ and $Ar^{2a}$ are independently a substituted or unsubstituted C6 to C30 aryl group or a substituted or unsubstituted C3 to C30 heteroaryl group, $Ar^{1a}$ and $Ar^{2a}$ are independently present alone or are linked with each other to form a fused ring, and $R^{1a}$ to $R^{3a}$, $R^a$, and $R^b$ are independently hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen or cyano group.

For example, $Ar^1$ and $Ar^2$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, and a substituted or unsubstituted pyridopyridazinyl group.

For example, Ar1 and Ar2 may be linked with each other to form a ring or for example, Ar1 and Ar2 may be linked with each other by one of a single bond, —(CRgRh)n2— (n2 is 1 or 2), —O—, —S—, —Se—, —N=, —NRi—, —SiRjRk—, and —GeRlRm— to form a ring.

Herein, Rg to Rm may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the first photoelectric conversion material may be represented by Chemical Formula 1 aa, but is not limited thereto.

[Chemical Formula 1aa]

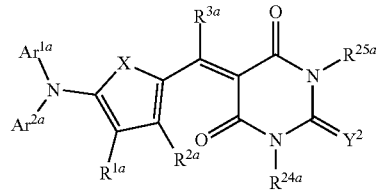

In Chemical Formulae 1A-1 to 1A-4,

X, $Ar^{1a}$, $Ar^{2a}$, and $R^{1a}$ to $R^{3a}$ are the same as described above, $Y^2$ is one of O, S, Se, Te, and $C(R^f)(CN)$, and $R^{24a}$, $R^{25a}$, and $R^f$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the first photoelectric conversion material may be one of compounds of Group 1, but is not limited thereto.

[Group 1]

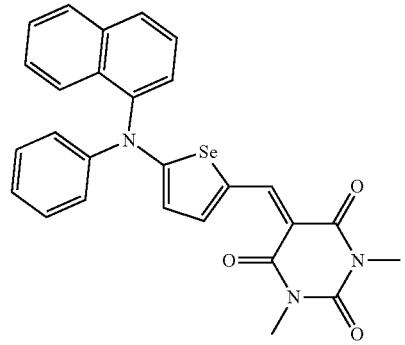

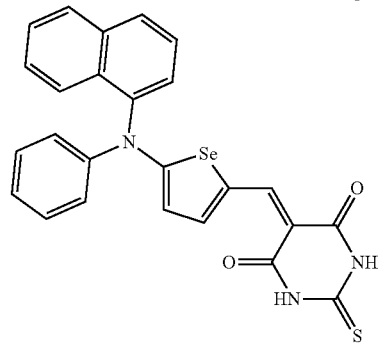

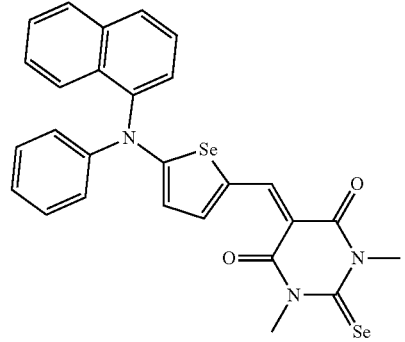

15
-continued
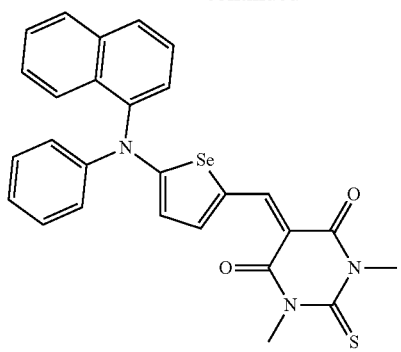
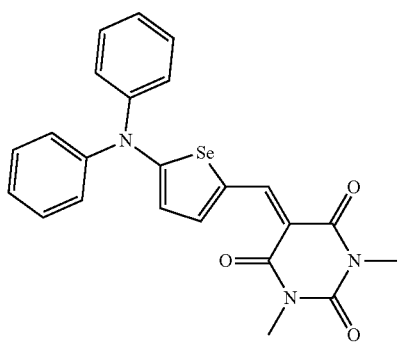
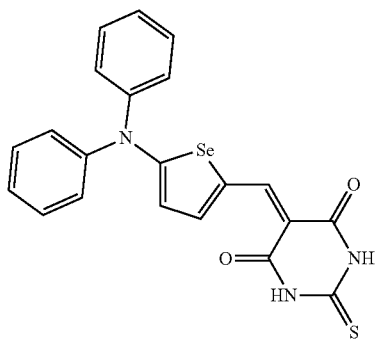
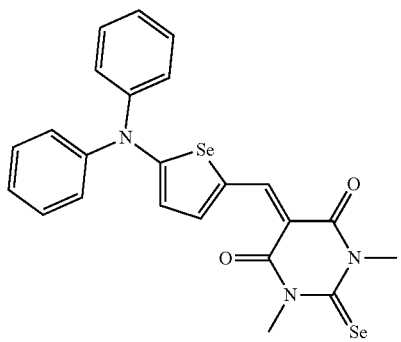
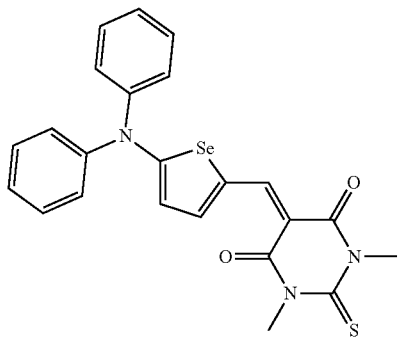
16
-continued
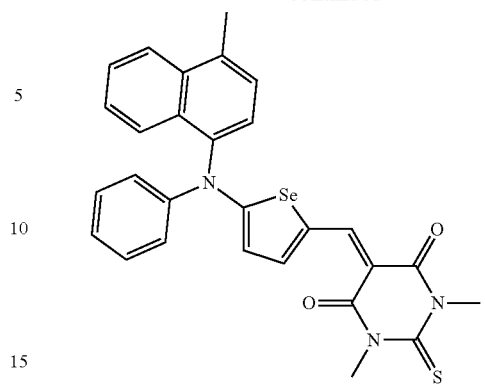
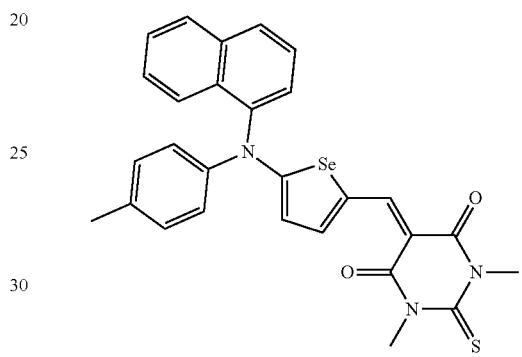
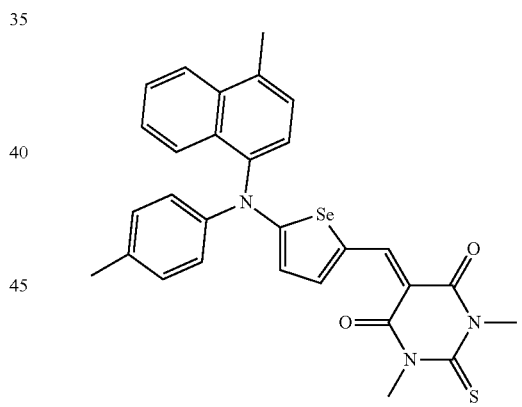
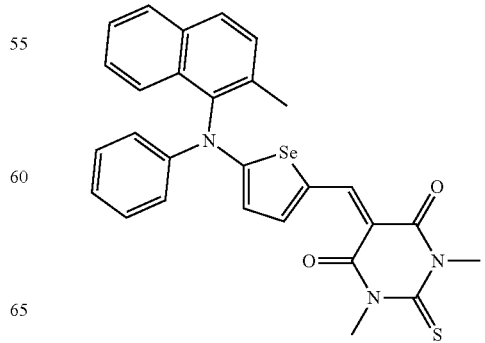

-continued
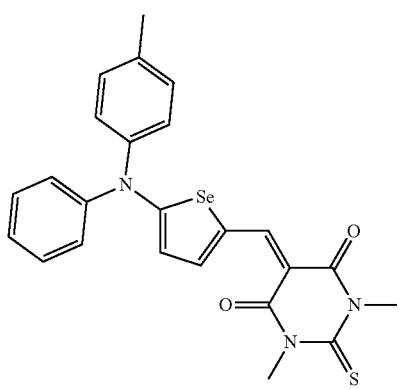
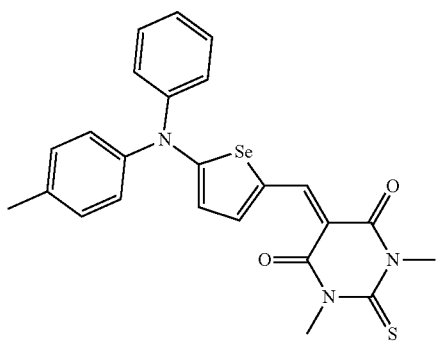
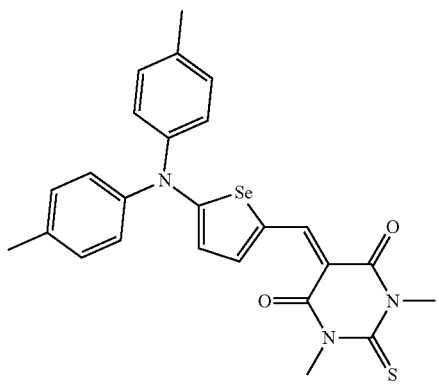
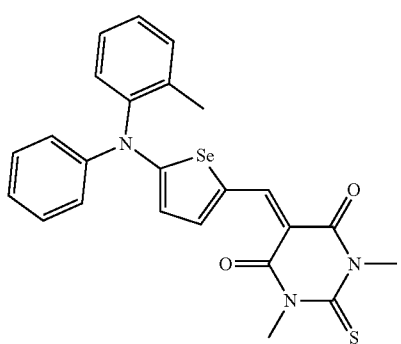
-continued
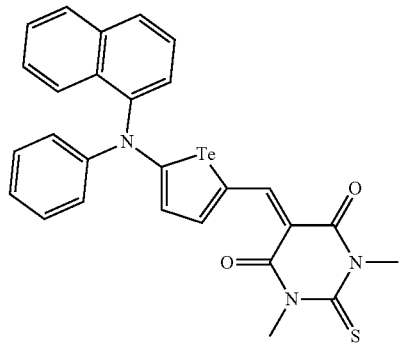
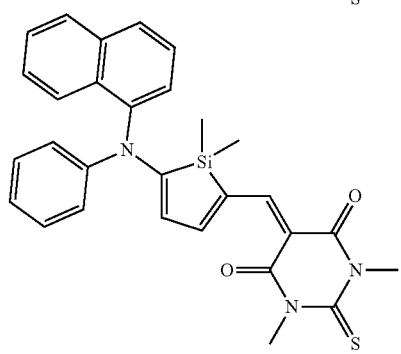
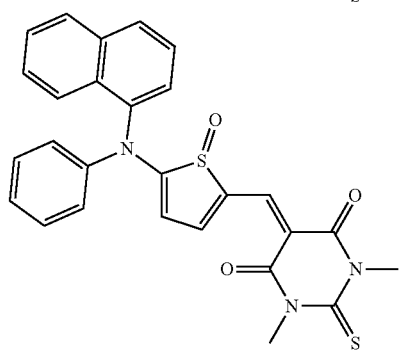
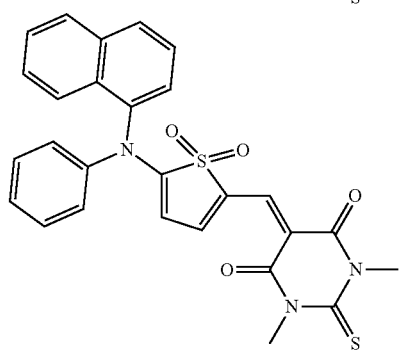
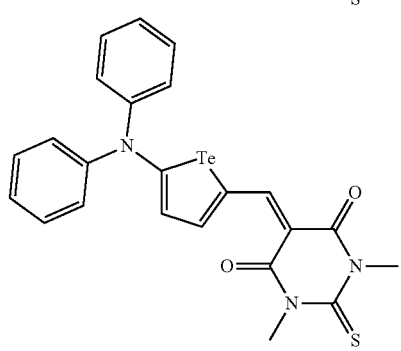

19
-continued
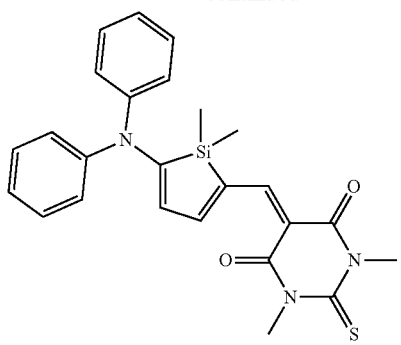
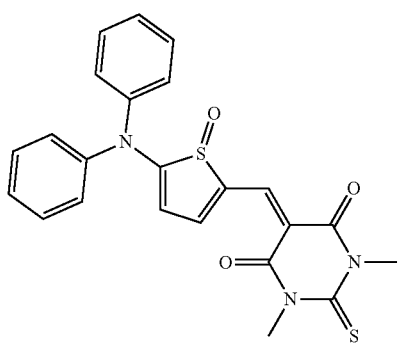
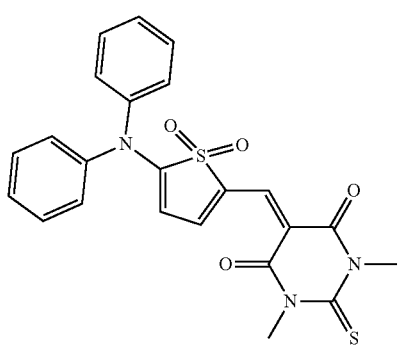
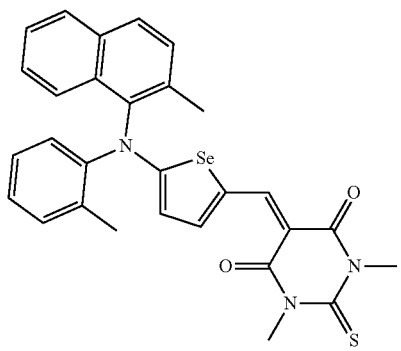
20
-continued
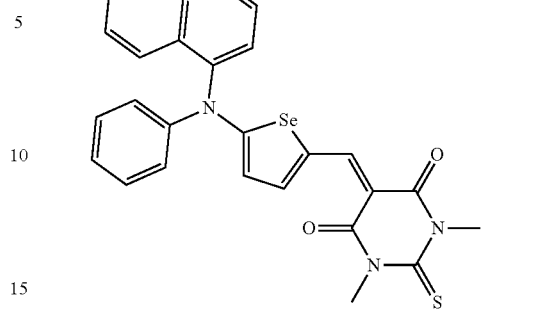
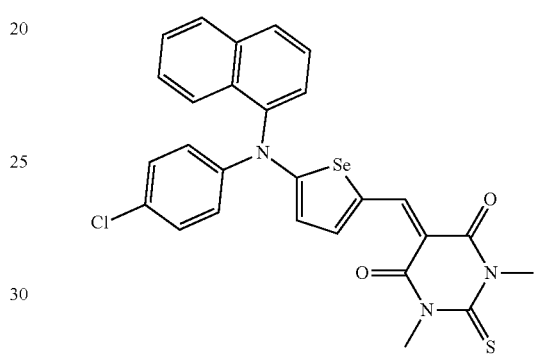
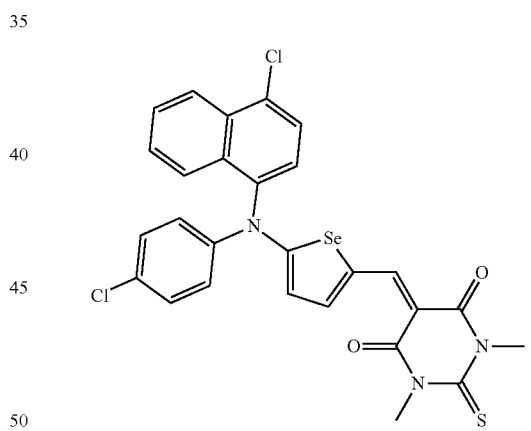
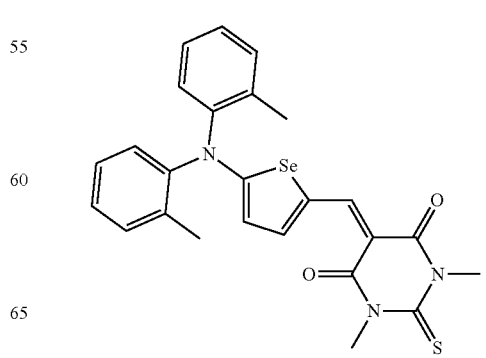

-continued
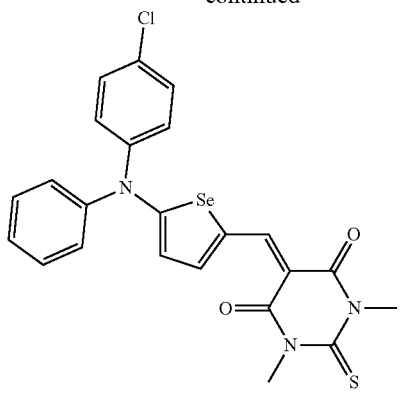
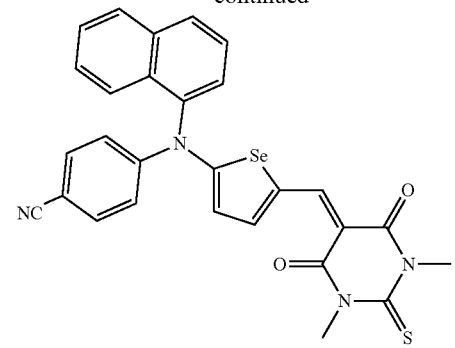
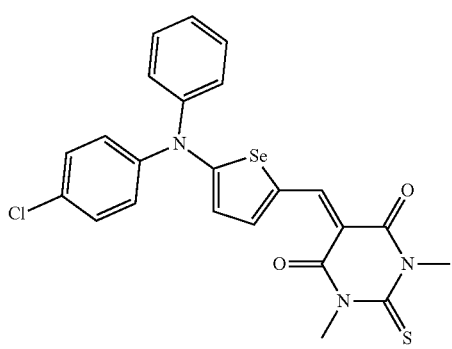
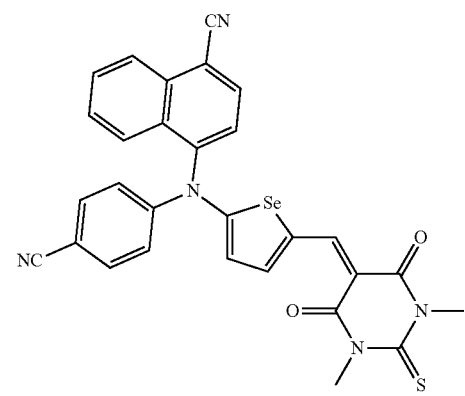
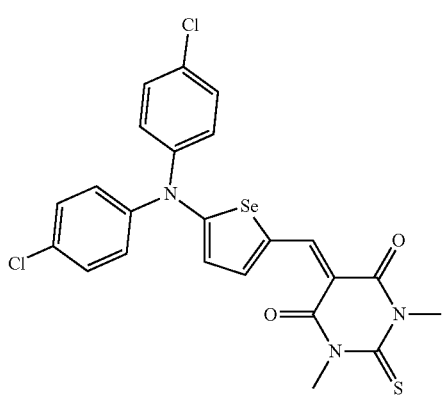
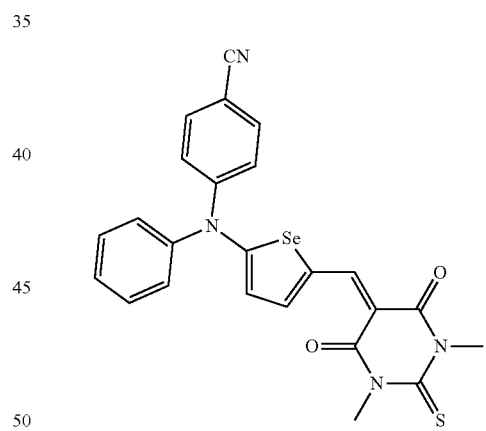
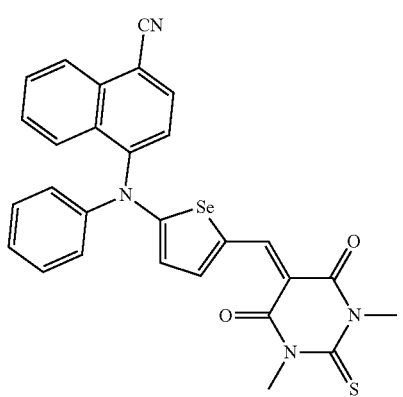
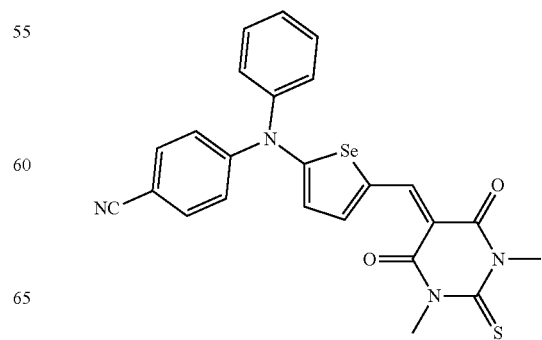

-continued
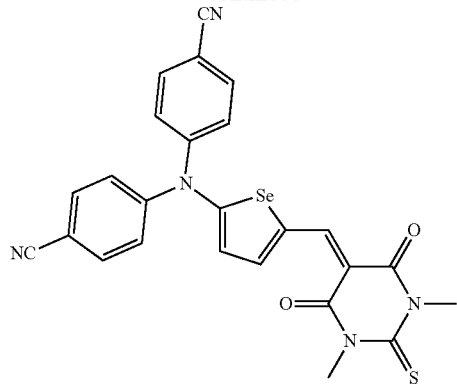
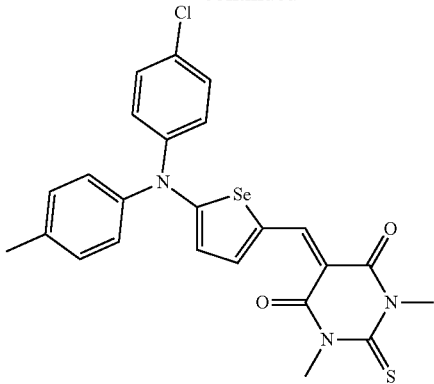
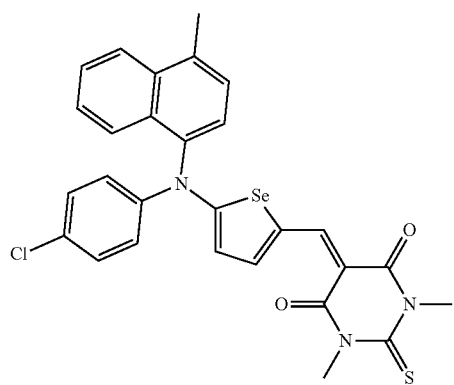
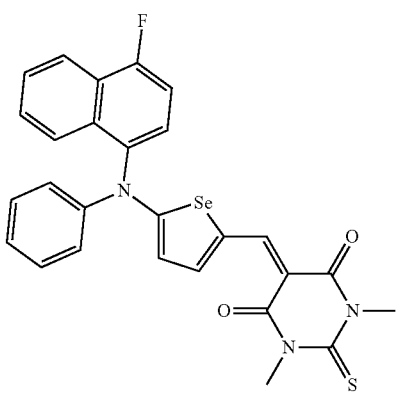
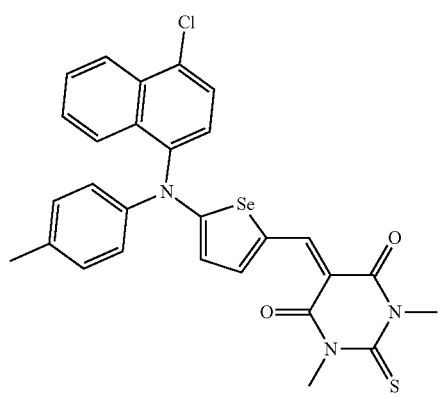
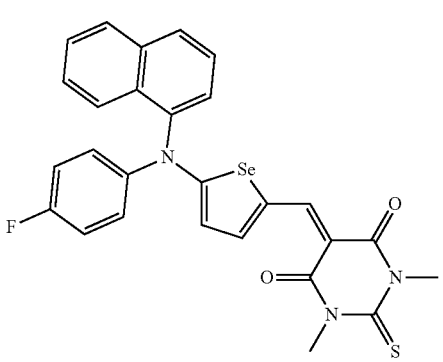
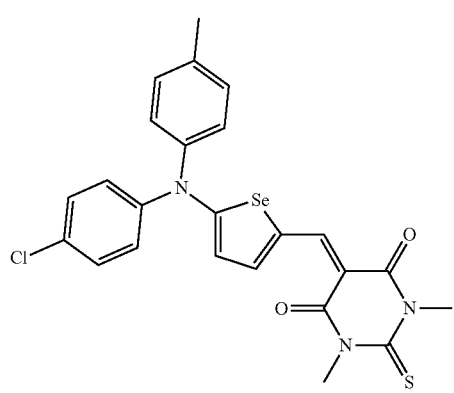
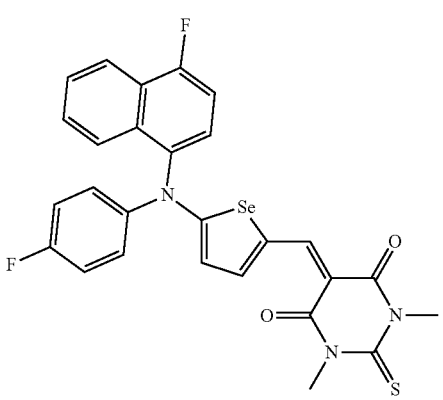

-continued
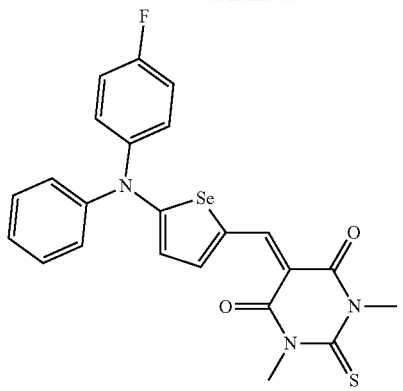
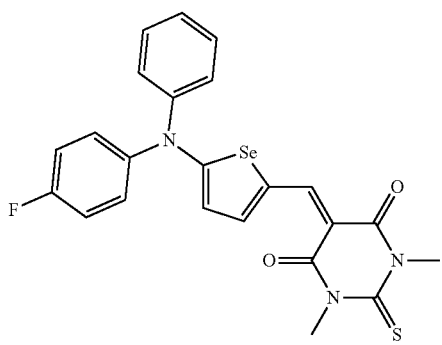
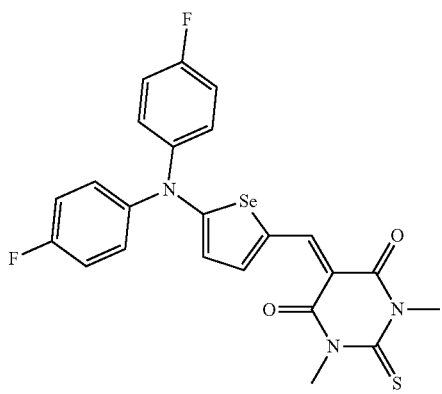
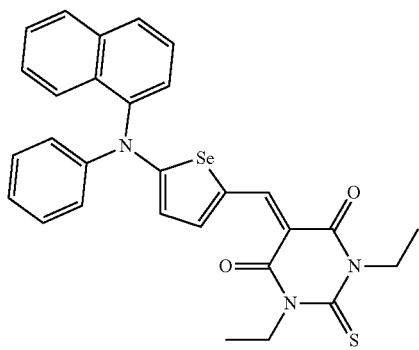
-continued
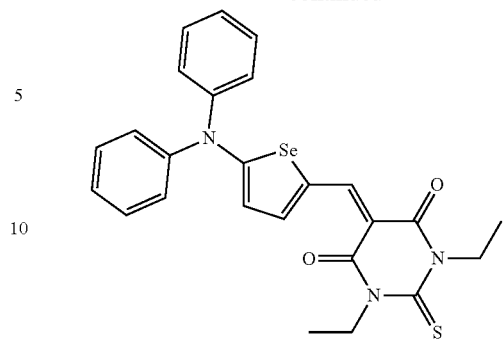
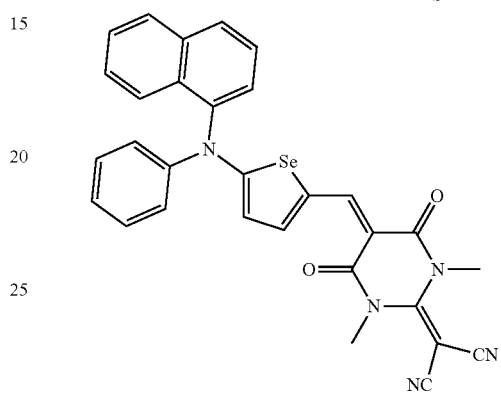
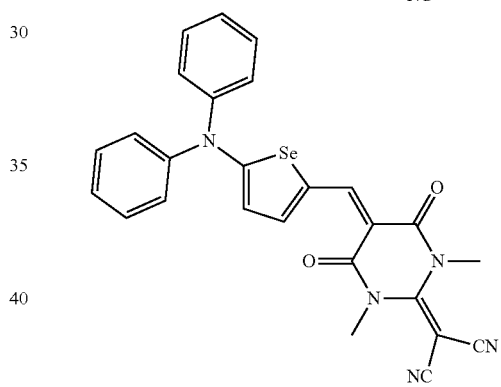
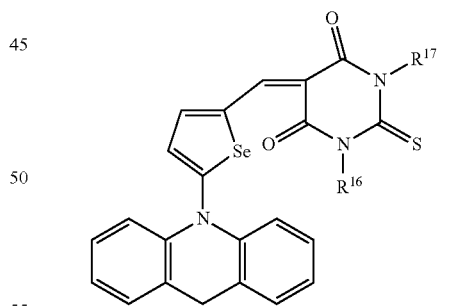
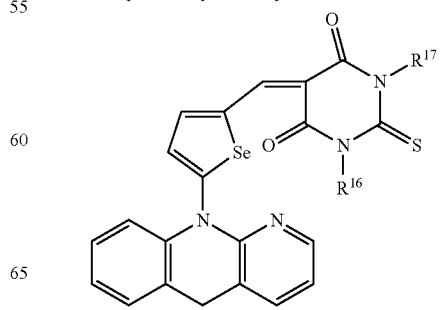

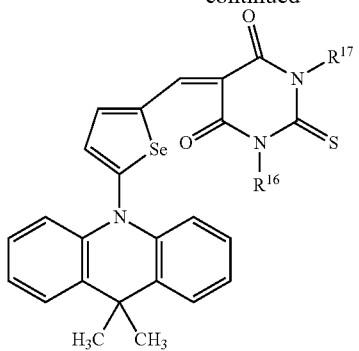
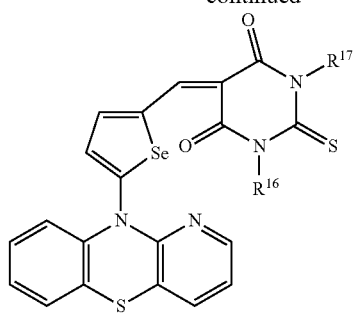
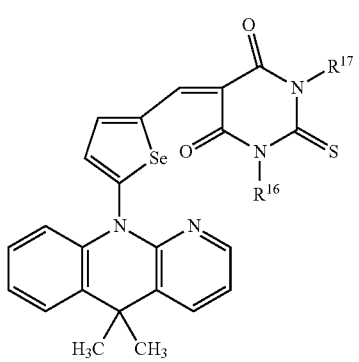
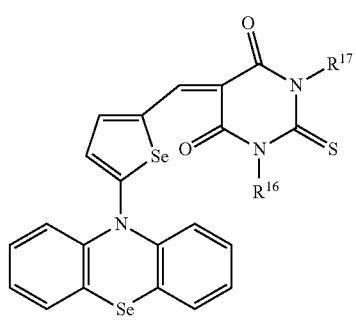
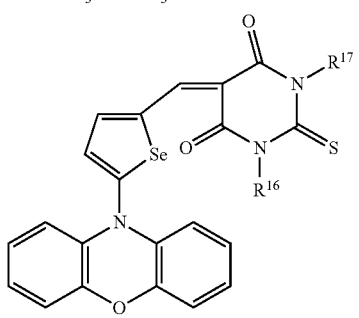
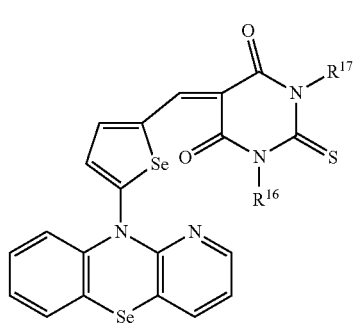
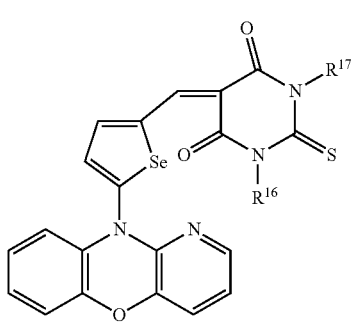
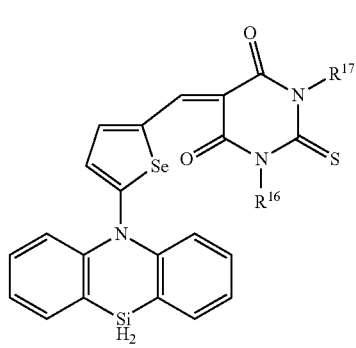
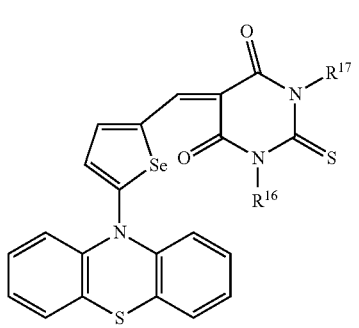
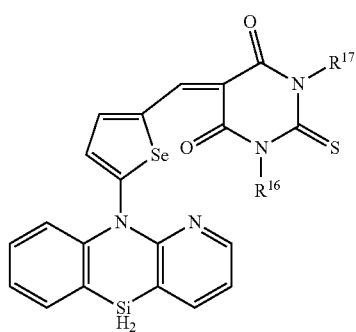

-continued
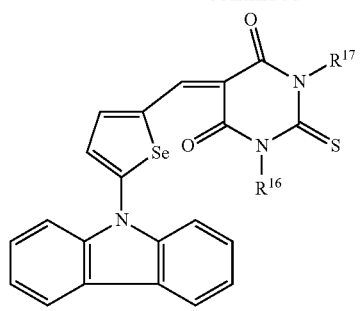
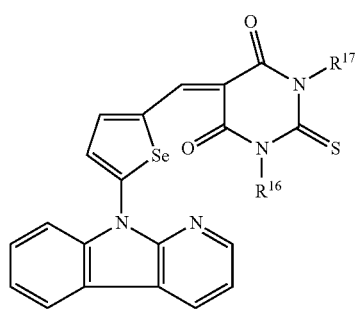
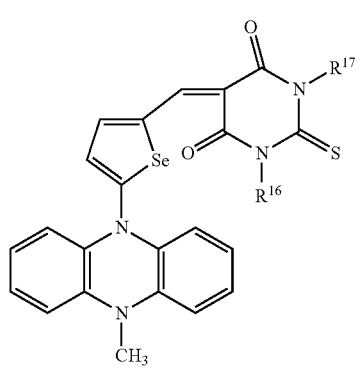
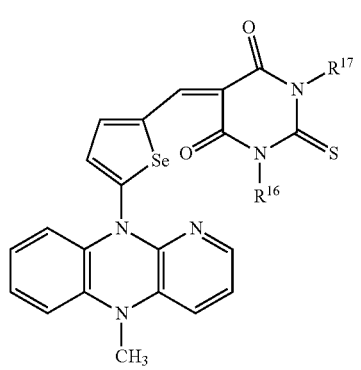
-continued
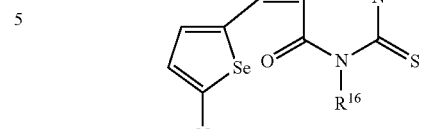
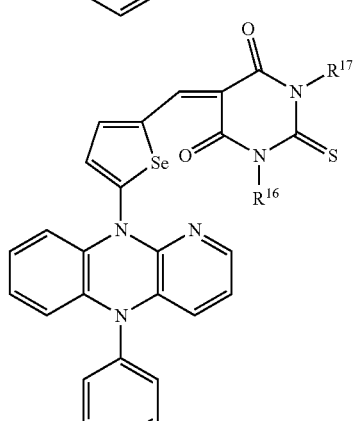
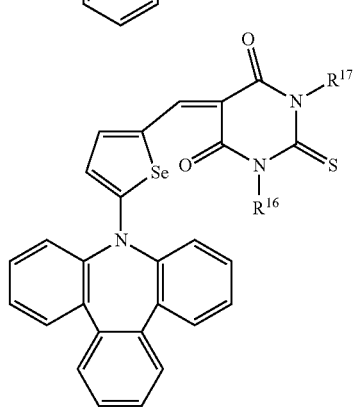
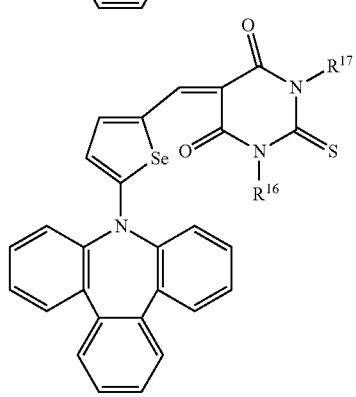
In Group 1,
hydrogen of each aromatic ring is replaced by a substituent selected from a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, and a combination thereof, and $R^{16}$, $R^{17}$, $R^{18}$, $R^{20}$, $R^f$ are independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or a combination thereof.

For example, the second photoelectric conversion material may be represented by Chemical Formula 1b, but is not limited thereto.

[Chemical Formula 1b]

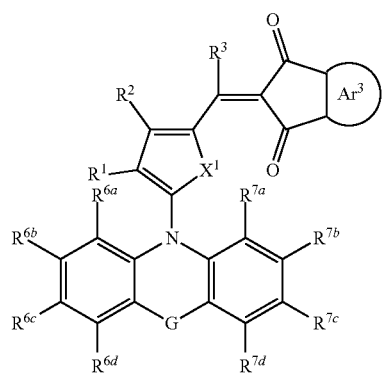

In Chemical Formula 1b, $X^1$ is Se, Te, O, S, SO, or $SO_2$, $Ar^3$ is a substituted or unsubstituted C6 to C30 arylene group, a substituted or unsubstituted C3 to C30 heterocyclic group, or a fused ring of the foregoing two or more, $R^1$ to $R^3$ are independently one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, and a combination thereof, G is one of a single bond, —O—, —S—, —Se—, —N═, —(CR$^f$R$^g$)$_k$—, —NR$^h$—, —SiR$^i$R$^i$—, —GeR$^k$R$^l$—, —(C(R$^m$)═C(R$^n$))—, and SnR$^o$R$^p$, wherein R$^f$, R$^g$, R$^h$, R$^i$, R$^j$, R$^k$, R$^l$, R$^m$, R$^n$, R$^o$, and R$^p$ are independently one of hydrogen, a halogen, a substituted or unsubstituted C1 to C10 alkyl group, a substituted or unsubstituted C1 to C10 alkoxy group, and a substituted or unsubstituted C6 to C12 aryl group, R$^f$ and R$^g$, R$^i$ and R$^j$, R$^k$ and R$^l$, R$^m$ and R$^n$, and R$^o$ and R$^p$ are independently present alone or linked with each other to provide a ring, and k is 1 or 2, $R^{6a}$ to $R^{6d}$ and $R^{7a}$ to $R^{7d}$ are independently one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, and a combination thereof, $R^{6a}$ to $R^{6d}$ are independently present alone or adjacent two thereof are linked with each other to form a fused ring, and $R^{7a}$ to $R^{7d}$ are independently present alone or adjacent two thereof are linked with each other to form a fused ring.

For example, $Ar^3$ of Chemical Formula 1b may be benzene, naphthylene, anthracene, thiophene, selenophene, tellurophene, pyridine, pyrimidine, or a fused ring of the foregoing two or more.

For example, the second photoelectric conversion material may be one of compounds of Group 2, but is not limited thereto.

[Group 2]

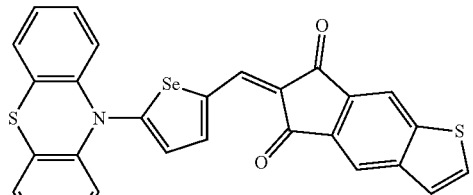

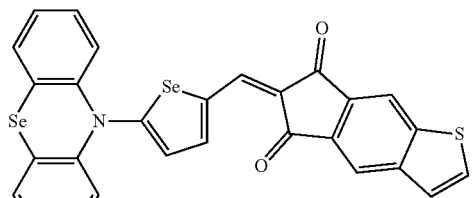

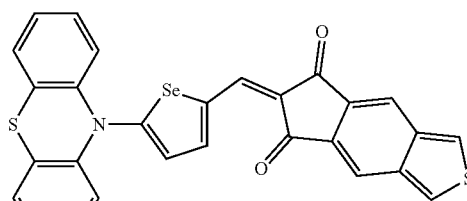

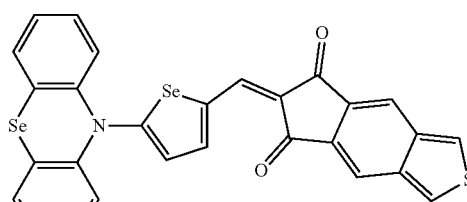

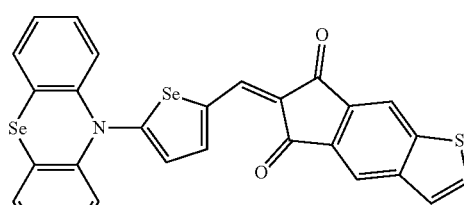

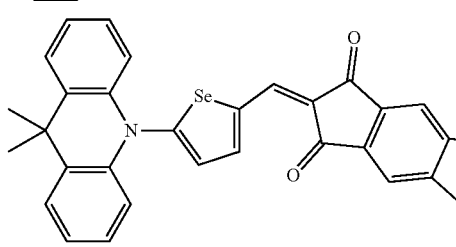

33
-continued
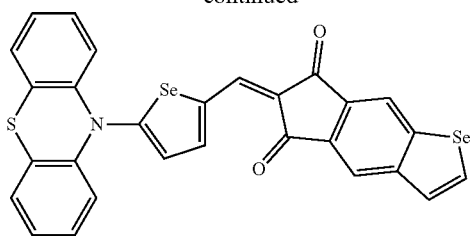
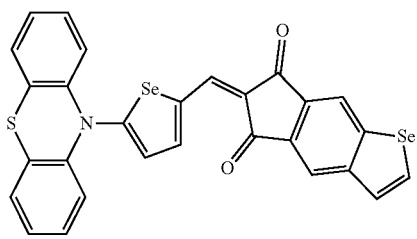
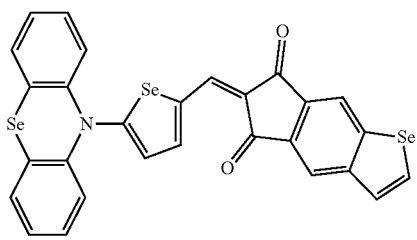
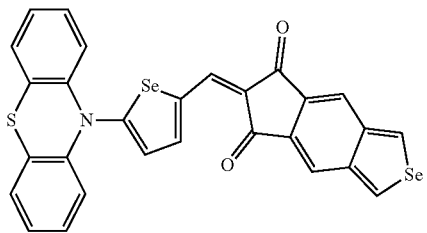
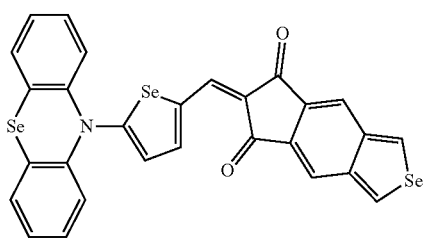
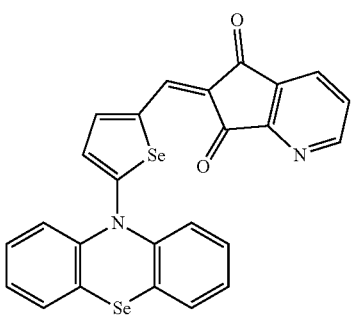
34
-continued
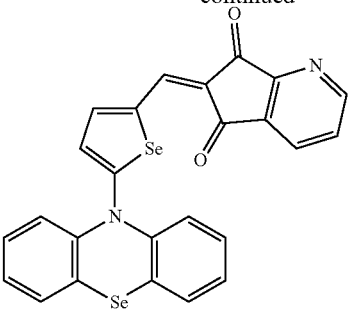
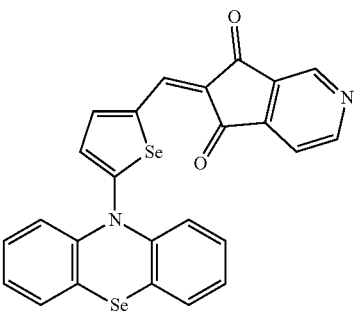
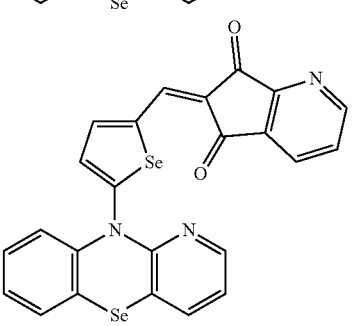
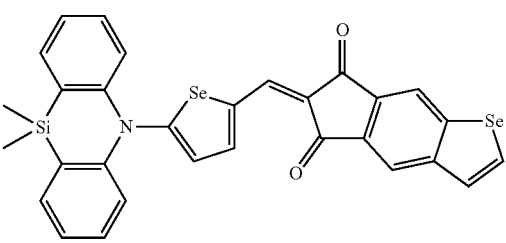
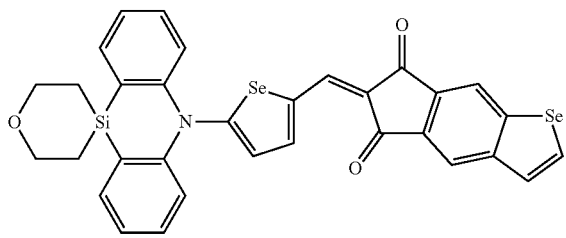
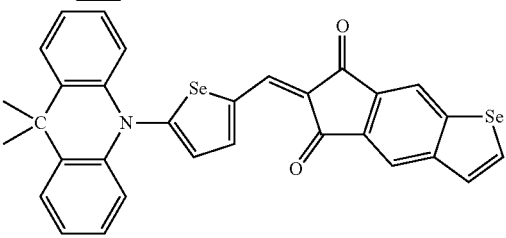

35
-continued
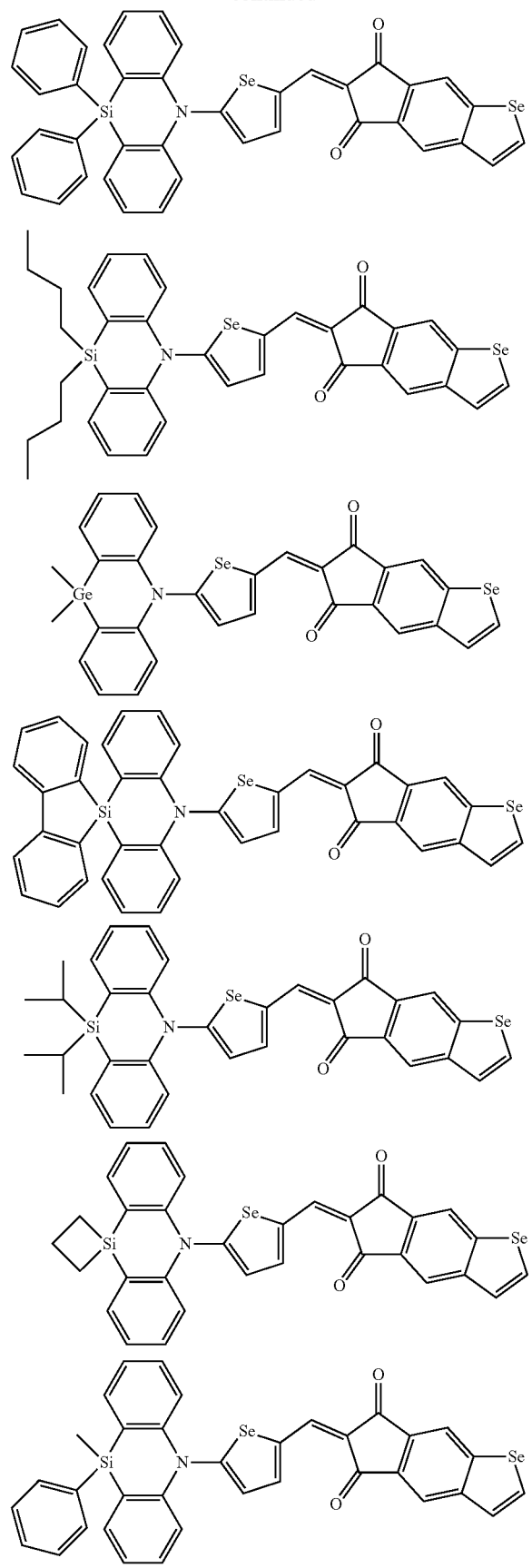
36
-continued
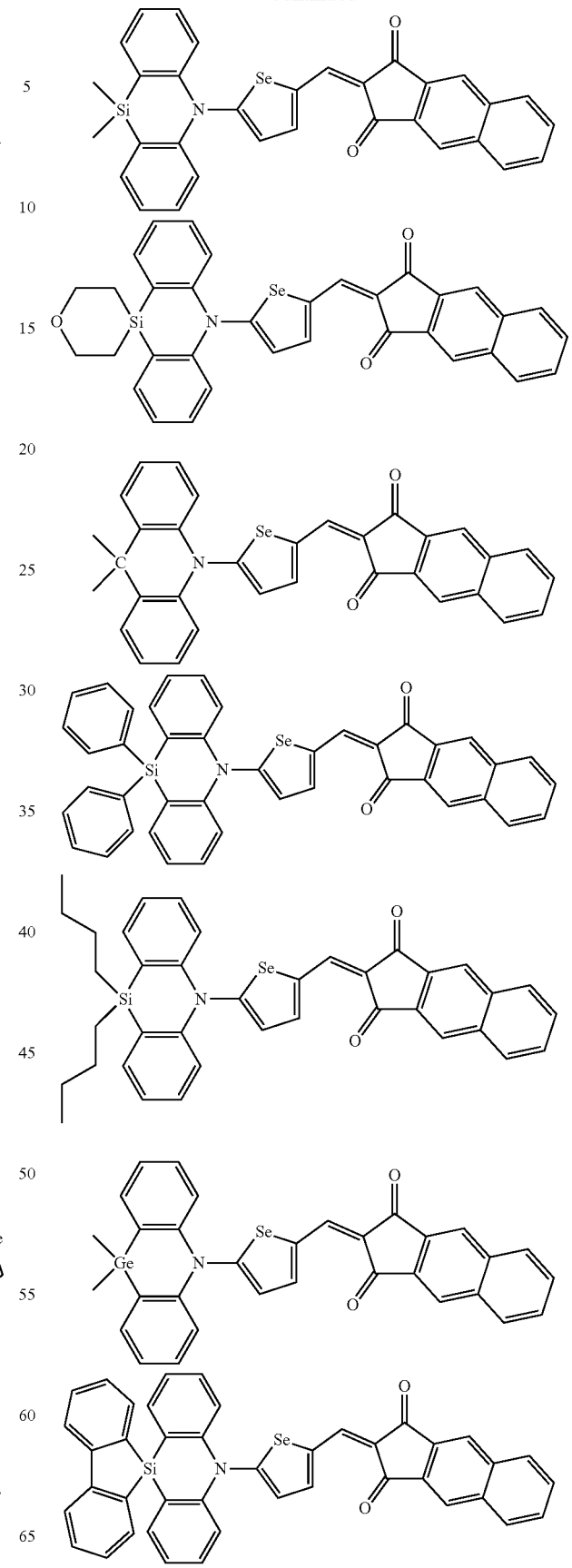

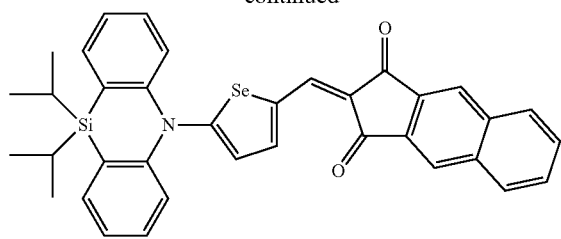
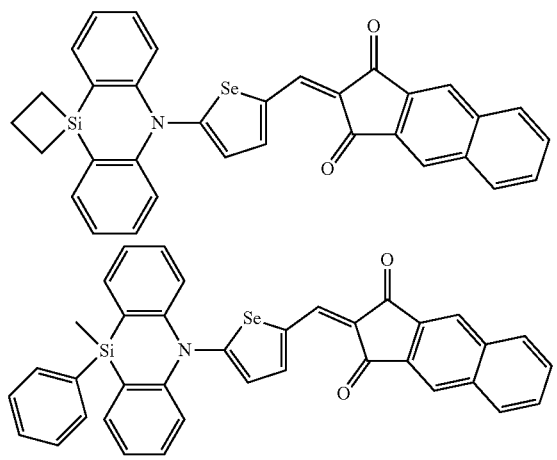
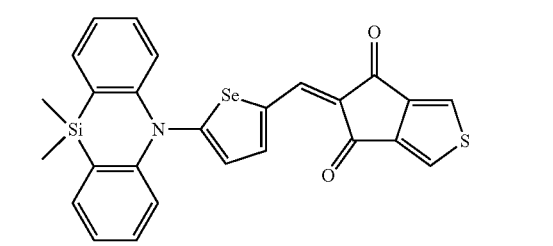
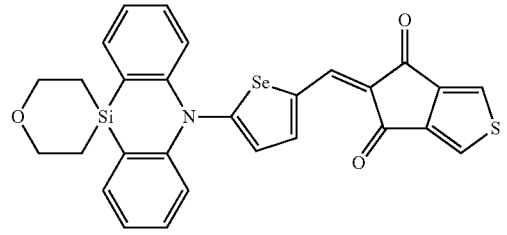
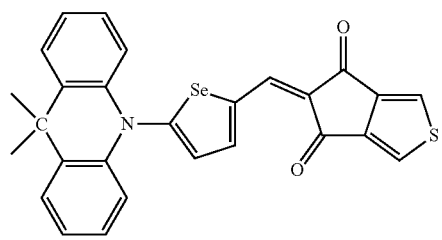
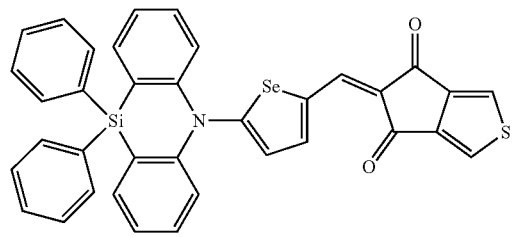
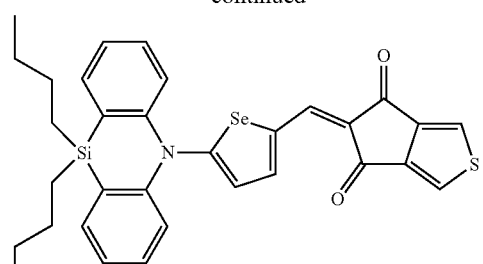
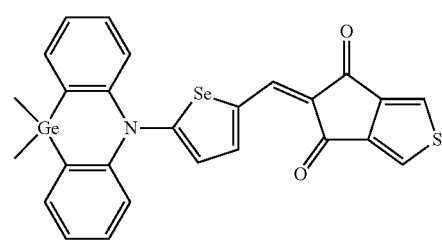
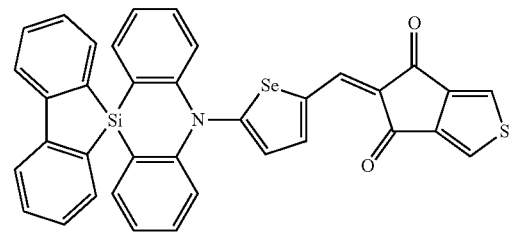
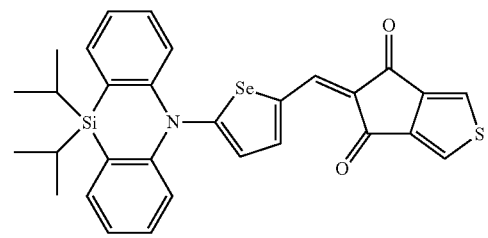
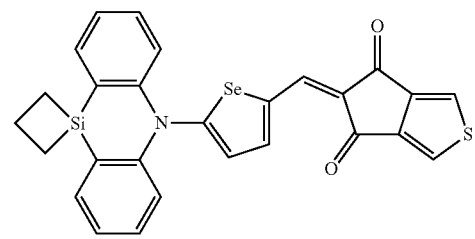
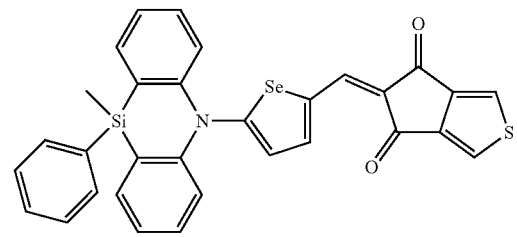
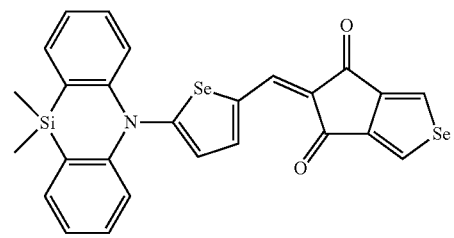

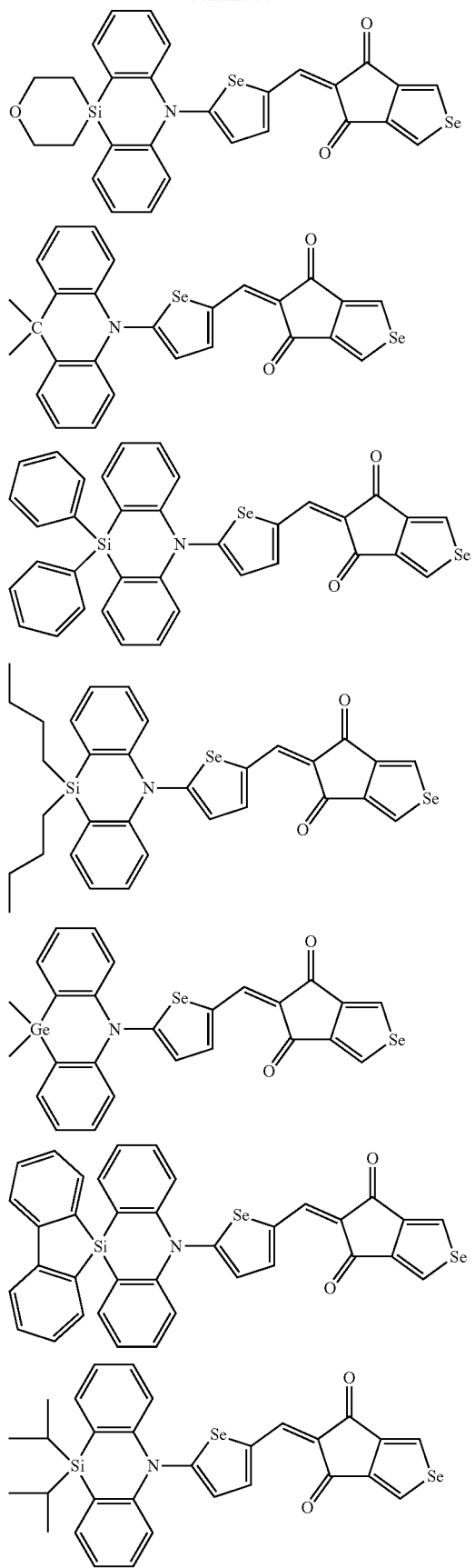
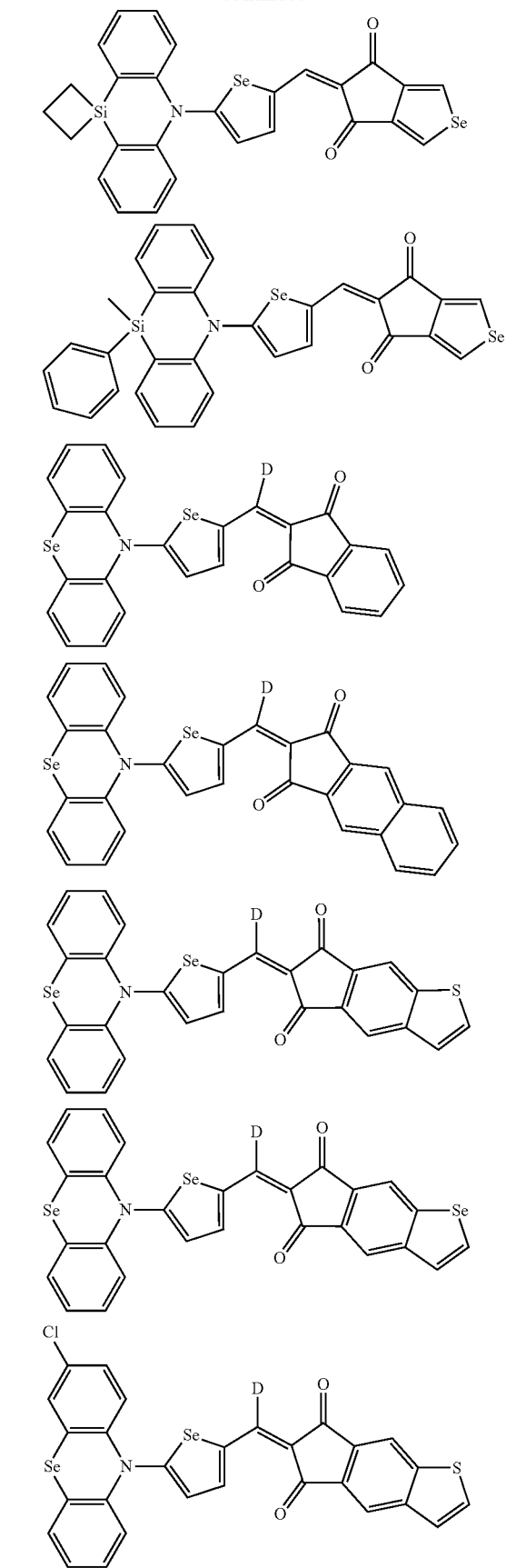

-continued

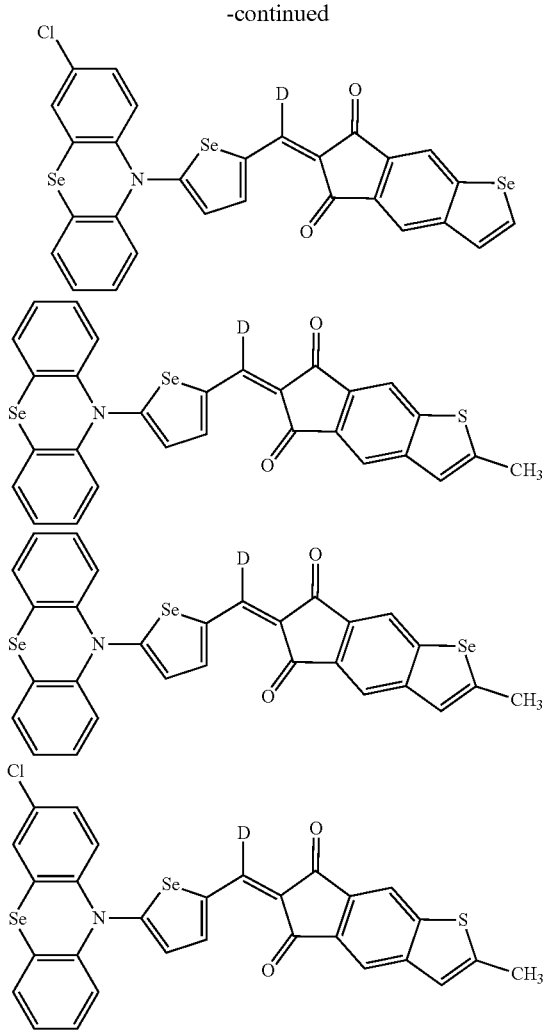

The first and second photoelectric conversion materials may be included in various ratios in the photoelectric conversion layer, and for example the first photoelectric conversion material may be included in the same amount as or in a larger amount than the second photoelectric conversion material, and for example a first and second photoelectric conversion materials may be included in a weight ratio of about 50:50 to about 95:5.

For example, each of the first and second photoelectric conversion materials may be a p-type semiconductor.

The n-type semiconductor may be any counter material of the p-type semiconductor without a particular limit, for example, a light absorbing material, for example, a light absorbing material absorbing at least one part of light in a visible ray region, and for example, fullerene or a fullerene derivative but is not limited thereto.

For example, at least one of the first and second photoelectric conversion materials may be an n-type semiconductor.

The photoelectric conversion layer 30 may be an intrinsic layer (an I layer) wherein the p-type semiconductor and the n-type semiconductor are mixed as a bulk heterojunction.

Herein, the p-type semiconductor and the n-type semiconductor may be mixed in a volume ratio of about 1:9 to about 9:1, within the range, for example, in a volume ratio of about 2:8 to about 8:2, about 3:7 to about 7:3, about 4:6 to about 6:4, or about 5:5.

The photoelectric conversion layer 30 may further include a p-type layer and/or an n-type layer that are disposed on a lower and/or upper surface of the intrinsic layer (I layer).

The organic photoelectric device 100 may further include an anti-reflection layer (not shown) on one surface of the first electrode 10 or the second electrode 20.

The anti-reflection layer is disposed at a light incidence side and lowers reflectance of light of incident light and thereby light absorbance is further improved.

For example, when light enters from the first electrode 10, the anti-reflection layer may be disposed on the first electrode 10 while when light enters from the second electrode 20, the anti-reflection layer may be disposed under the second electrode 20.

The anti-reflection layer may include, for example a material having a refractive index of about 1.6 to about 2.5, and may include for example at least one of a metal oxide, a metal sulfide, and an organic material having a refractive index within the ranges.

The anti-reflection layer may include, for example a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium -containing oxide, or a combination thereof; a metal sulfide such as zinc sulfide; or an organic material such as an amine derivative, but is not limited thereto.

In the organic photoelectric device 100, when light enters from the first electrode 10 or the second electrode 20 and the photoelectric conversion layer 30 absorbs light in a predetermined or alternatively, desired wavelength region, excitons may be produced from the inside.

The excitons are separated into holes and electrons in the photoelectric conversion layer 30, and the separated holes are transported to an anode that is one of the first electrode 10 and the second electrode 20 and the separated electrons are transported to the cathode that is the other of the first electrode 10 and the second electrode 20 so as to flow a current.

Hereinafter, an organic photoelectric device according to example embodiments is described.

Figure 2:
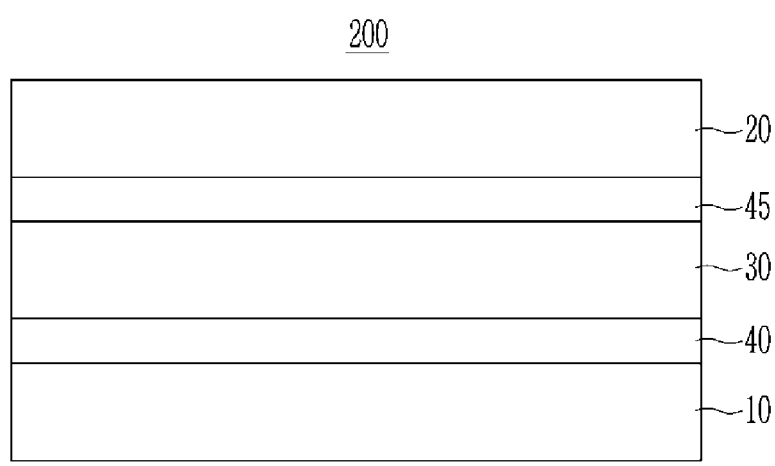
FIG. 2 is a cross-sectional view showing an organic photoelectric device according to another example embodiment.

FIG. 2 is a cross-sectional view showing an organic photoelectric device according to another example embodiment.

Referring to FIG. 2, the organic photoelectric device 200 according to an example embodiment includes a first electrode 10 and a second electrode 20 and a photoelectric conversion layer 30 disposed between the first electrode 10 and the second electrode 20, like the above example embodiment.

The first electrode 10, the second electrode 20, and the photoelectric conversion layer 30 are the same as described above.

However, the organic photoelectric device ®according to the an example embodiment further includes each charge auxiliary layer 40 and 45 between the first electrode 10 and the photoelectric conversion layer 30 and the second electrode 20 and the photoelectric conversion layer 30, unlike the above example embodiment.

The charge auxiliary layers 40 and 45 may make holes and electrons separated in the photoelectric conversion layer 30 be transported easily to improve efficiency.

The charge auxiliary layers 40 and 45 may include at least one selected from a hole injection layer for facilitating hole injection, a hole transport layer for facilitating hole transport, an electron blocking layer for preventing electron transport, an electron injection layer for facilitating electron injection, an electron transport layer for facilitating electron transport, and a hole blocking layer for preventing hole transport.

The charge auxiliary layers 40 and 45 may include for example an organic material, an inorganic material, or an organic/inorganic material.

The organic material may be an organic material having hole or electron characteristics and the inorganic material may be for example a metal oxide such as a molybdenum oxide, a tungsten oxide, or a nickel oxide.

The hole injection layer (HIL) and/or The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, Alq3, Gaq3, Inq3, Znq2, Zn(BTZ)2, BeBq2, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, Alq3, Gaq3, Inq3, Znq2, Zn(BTZ)2, BeBq2, and a combination thereof, but is not limited thereto.

Either one of the charge auxiliary layers 40 and 45 may be omitted.

The organic photoelectric device may be applied to an image sensor, a photodetector, a photosensor, and an organic light emitting diode (OLED), and the like, but is not limited thereto.

The organic photoelectric device may be for example applied to an image sensor.

Hereinafter, an example of an image sensor including the organic photoelectric device is described referring to drawings.

As an example of an image sensor, an organic CMOS image sensor is described.

Figure 3:
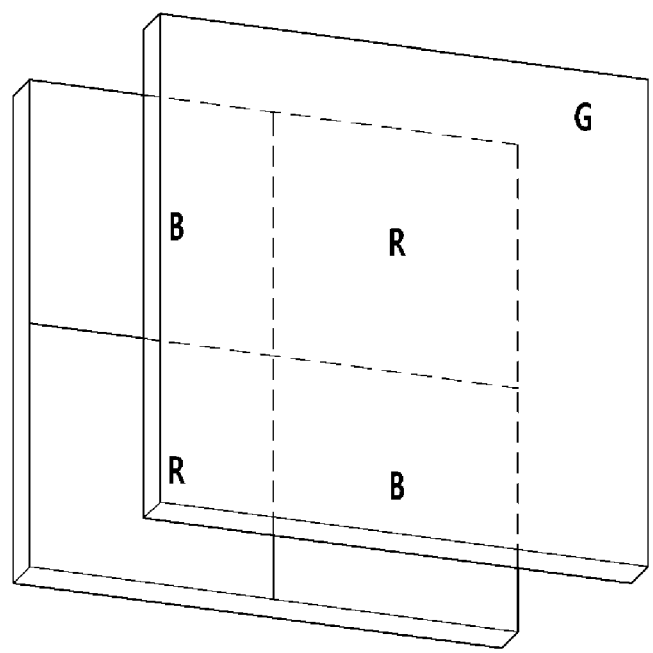
FIG. 3 is a schematic top plan view showing an organic CMOS image sensor according to an example embodiment.
Figure 4A:
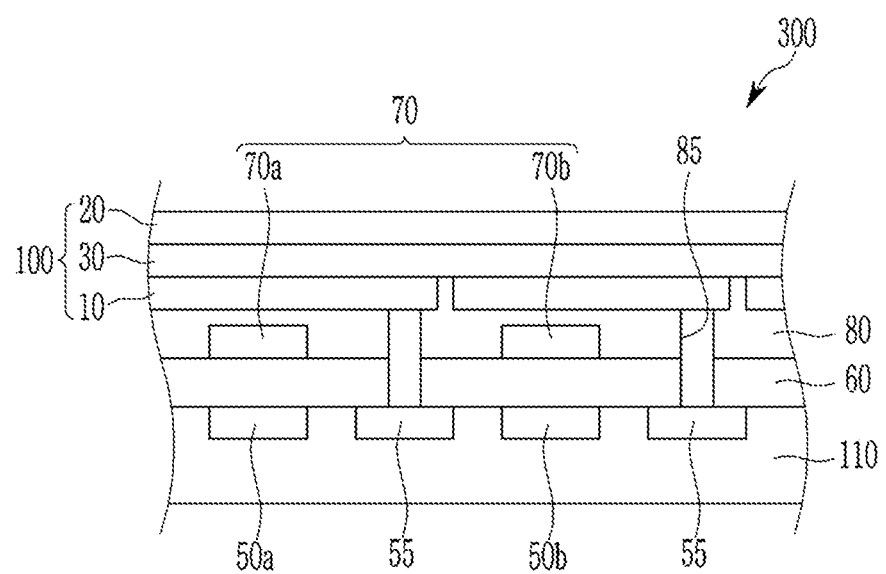
FIGS. 4A and 4B are cross-sectional views showing examples of the organic CMOS image sensor of FIG. 3.
Figure 4B:
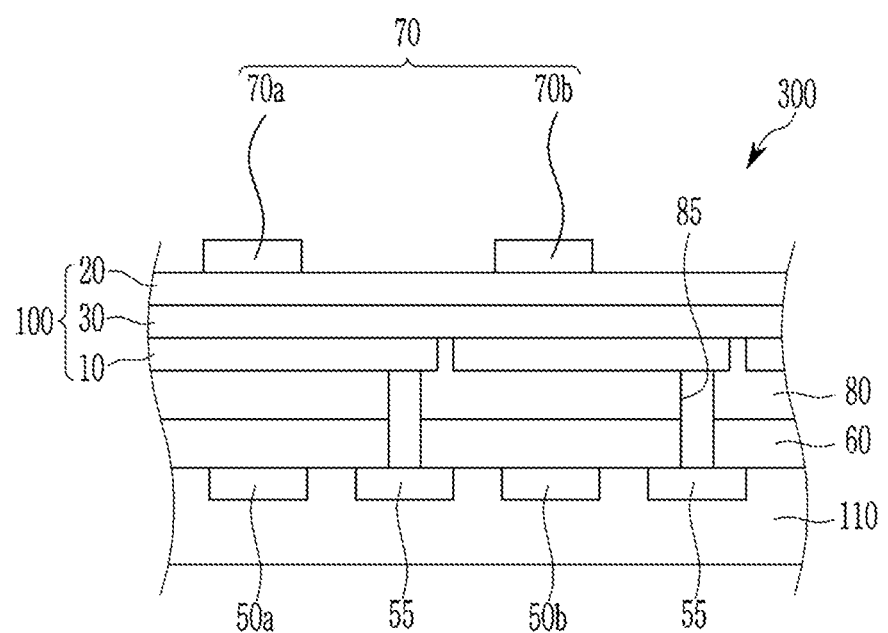

FIG. 3 is a schematic top plan view of an organic CMOS image sensor according to an example embodiment and FIG. 4A and 4B are a cross-sectional view showing examples of the organic CMOS image sensor of FIG. 3.

Referring to FIGS. 3, 4A and 4B, an organic CMOS image sensor 300 according to an example embodiment includes a semiconductor substrate 110 integrated with photo-sensing devices 50*a* and 50*b*, a transmission transistor (not shown) and a charge storage 55, a lower insulation layer 60, a color filter layer 70, an upper insulation layer 80, and/or an organic photoelectric device 100.

The semiconductor substrate 110 may be a silicon substrate, and is integrated with the photo-sensing devices 50*a* and 50*b*, the transmission transistor (not shown), and the charge storage 55.

The photo-sensing devices 50*a* and 50*b* may be photodiodes.

The photo-sensing devices 50*a* and 50*b*, the transmission transistor, and/or the charge storage 55 may be integrated in each pixel, and as shown in the drawing, the photo-sensing devices 50*a* and 50*b* may be included in a blue pixel and a red pixel and the charge storage 55 may be included in a green pixel.

The photo-sensing devices 50*a* and 50*b* sense light, the information sensed by the photo-sensing devices may be transferred by the transmission transistor, the charge storage 55 is electrically connected to the organic photoelectric device 100 that will be described later, and the information of the charge storage 55 may be transferred by the transmission transistor.

A metal wire (not shown) and a pad (not shown) are formed on the semiconductor substrate 110.

In order to decrease signal delay, the metal wire and pad may be made of a metal having low resistivity, for example, aluminum (Al), copper (Cu), silver (Ag), and alloys thereof, but are not limited thereto.

Further, it is not limited to the structure, and the metal wire and pad may be disposed under the photo-sensing device 50*a* and 50*b*.

The lower insulation layer 60 is formed on the metal wire and the pad.

The lower insulation layer 60 may be made of an inorganic insulating material such as a silicon oxide and/or a silicon nitride, or a low dielectric constant (low K) material such as SiC, SiCOH, SiCO, and SiOF.

The lower insulation layer 60 has a trench exposing the charge storage 55.

The trench may be filled with fillers.

In FIG. 4A, a color filter layer 70 is formed on the lower insulation layer 60.

The color filter layer 70 includes a blue filter 70*a* formed in a blue pixel and a red filter 70*b* in a red pixel.

In the example embodiment, a green filter is not included, but a green filter may be further included.

The upper insulation layer 80 is formed on the color filter layer 70.

The upper insulation layer 80 eliminates a step caused by the color filter layer 70 and smoothens the surface.

The upper insulation layer 80 and the lower insulation layer 60 may include a contact hole (not shown) exposing a pad, and a through-hole 85 exposing the charge storage 55 of the green pixel.

The organic photoelectric device 100 is formed on the upper insulation layer 80.

The organic photoelectric device 100 includes the first electrode 10, the photoelectric conversion layer 30, and the second electrode 20 as described above.

In the drawing, the first electrode 10, the photoelectric conversion layer 30, and the second electrode 20 are sequentially stacked, but this disclosure is not limited thereto, and for example they may be stacked in an order of the second electrode 20, the photoelectric conversion layer 30, and the first electrode 10.

The first electrode 10 and the second electrode 20 may be all light-transmitting electrodes and the photoelectric conversion layer 30 is the same as described above.

The photoelectric conversion layer 30 may for example selectively absorb light in a green wavelength region and may replace a color filter of a green pixel.

Light in a green wavelength region of light that enters from the second electrode 20 is mainly absorbed by the photoelectric conversion layer 30 and photoelectrically converted and light in a remaining wavelength region is transmitted through the first electrode 10 and is sensed by the photo-sensing devices 50a and 50b.

In FIG. 4B, a color filter layer 70 is formed on the organic photoelectric device 100, unlike the organic CMOS image sensor shown in FIG. 4A.

Focusing lens (not shown) may be further formed on the organic photoelectric device 100.

The focusing lens may control a direction of incident light and gather the light in one region.

The focusing lens may have a shape of, for example, a cylinder or a hemisphere, but is not limited thereto.

As described above, the organic photoelectric device 100 has a stack structure thereby a size of an image sensor may be reduced to realize a down-sized image sensor.

In addition, as described above, optical properties and thermal properties required for the image sensor may be satisfied by including the organic photoelectric device 100 including the photoelectric conversion layer 30 having improved optical properties and/or higher heat resistance.

FIGS. 4A and 4B exemplarily show structures that the organic photoelectric device of FIG. 1 is stacked, but the organic photoelectric device of FIG. 2 may be equally applied thereto.

Figure 5:
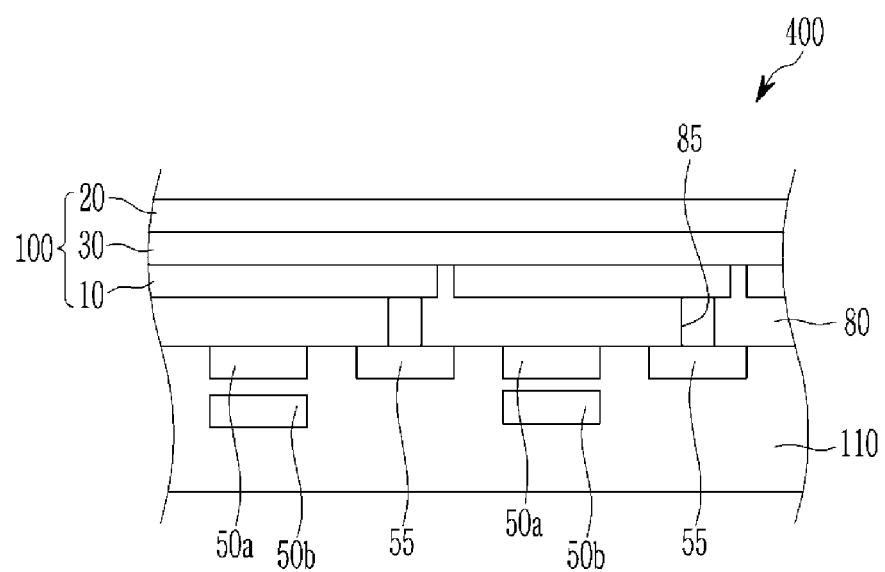
FIG. 5 is a cross-sectional view showing another example of the organic CMOS image sensor.

FIG. 5 is a cross-sectional view showing another example of the organic CMOS image sensor.

The organic CMOS image sensor 400 according to the example embodiment includes a semiconductor substrate 110 integrated with photo-sensing devices 50a and 50b, a transmission transistor (not shown), and a charge storage 55, an upper insulation layer 80 having a through-hole 85, and/or an organic photoelectric device 100, like the above example embodiment.

However, in the CMOS image sensor 400 according to the example embodiment unlike the above example embodiment, the photo-sensing devices 50a and 50b are stacked in a vertical direction, but the color filter layer 70 is omitted.

The photo-sensing devices 50a and 50b are electrically connected to charge storage (not shown) and may be transferred by the transmission transistor.

The photo-sensing devices 50a and 50b may selectively absorb light in each wavelength region depending on a stacking depth.

Focusing lens (not shown) may be further formed on the organic photoelectric device 100.

The focusing lens may control a direction of incident light and gather the light in one region.

The focusing lens may have a shape of, for example, a cylinder or a hemisphere, but is not limited thereto.

As described above, the organic photoelectric device configured to selectively absorb light in a green wavelength region has a stack structure and the red photo-sensing device and the blue photo-sensing device are stacked and thus the size of an image sensor may be reduced to realize a down-sized image sensor.

FIG. 5 exemplarily shows a structure that the organic photoelectric device of FIG. 1 is stacked, but the organic photoelectric device of FIG. 2 may be equally applied thereto.

Figure 6:
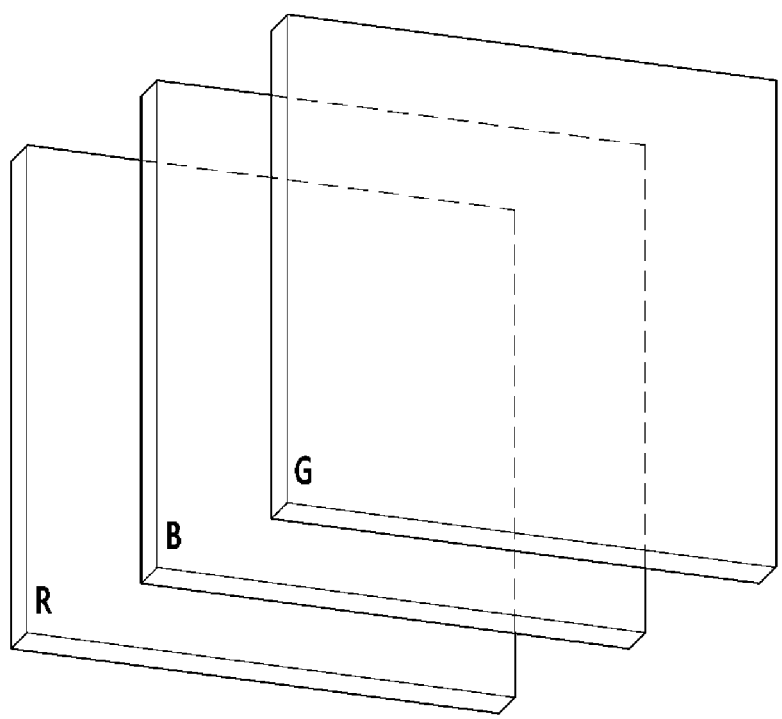
FIG. 6 is a schematic top plan view showing an organic CMOS image sensor according to another example embodiment.
Figure 7:
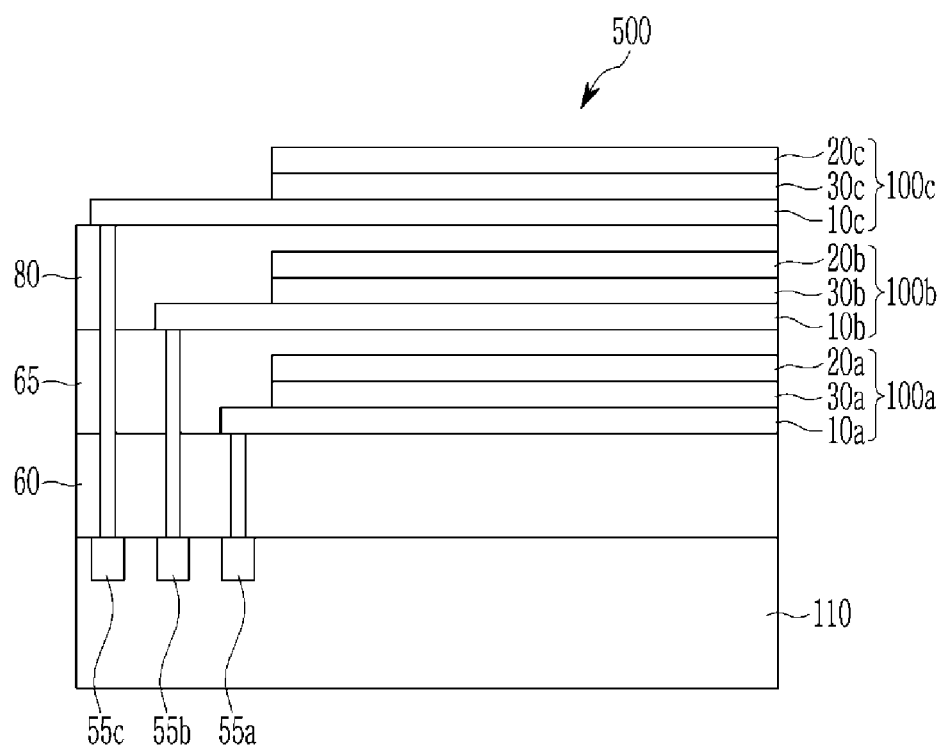
FIG. 7 is a cross-sectional view showing the organic CMOS image sensor of FIG. 6.

FIG. 6 is a schematic top plan view of an organic CMOS image sensor according to another example embodiment and FIG. 7 is a cross-sectional view of the organic CMOS image sensor of FIG. 6.

The organic CMOS image sensor 500 according to the example embodiment includes a green photoelectric device configured to selectively absorb light in a green wavelength region, a blue photoelectric device configured to selectively absorb light in a blue wavelength region, and a red photoelectric device configured to selectively absorb light in a green wavelength region, and they are stacked.

The organic CMOS image sensor 500 according to the example embodiment includes a semiconductor substrate 110, a lower insulation layer 60, an intermediate insulation layer 65, an upper insulation layer 80, a first organic photoelectric device 100a, a second organic photoelectric device 100b, and/or a third organic photoelectric device 100c.

The semiconductor substrate 110 may be a silicon substrate, and is integrated with the transmission transistor (not shown) and the charge storages 55a, 55b, and 55c.

A metal wire (not shown) and a pad (not shown) are formed on the semiconductor substrate 110, and the lower insulation layer 60 is formed on the metal wire and the pad.

The first organic photoelectric device 100a is formed on the lower insulation layer 60.

The first organic photoelectric device 100a includes a first electrode 10a and a second electrode 20a facing each other and a photoelectric conversion layer 30a between the first electrode 10a and the second electrode 20a.

The first electrode 10a, the second electrode 20a, and the photoelectric conversion layer 30a are the same as described above and the photoelectric conversion layer 30a may selectively absorb light in one of red, blue, and green wavelength regions.

For example, the first organic photoelectric device 100a may be a red photoelectric device.

In the drawing, the first electrode 10a, the photoelectric conversion layer 30a, and the second electrode 20a are sequentially stacked, but this disclosure is not limited thereto, and for example they may be stacked in an order of the second electrode 20a, the photoelectric conversion layer 30a, and the first electrode 10a.

An intermediate insulation layer 65 is formed on the first organic photoelectric device 100a.

The second organic photoelectric device 100b is formed on the intermediate insulation layer 65.

The second organic photoelectric device 100b includes a first electrode 10b and a second electrode 20b facing each other and a photoelectric conversion layer 30b between the first electrode 10b and the second electrode 20b.

The first electrode 10b, the second electrode 20b, and the photoelectric conversion layer 30b may be described above and the photoelectric conversion layer 30b may selectively absorb light in one of red, blue, and green wavelength regions.

For example, the second organic photoelectric device 100b may be a blue photoelectric device.

In the drawing, the first electrode 10b, the photoelectric conversion layer 30b, and the second electrode 20b are sequentially stacked, but this disclosure is not limited thereto, and for example they may be stacked in an order of the second electrode 20b, the photoelectric conversion layer 30b, and the first electrode 10b.

The upper insulation layer 80 is formed on the second organic photoelectric device 100b.

The lower insulation layer 60, the intermediate insulation layer 65, and the upper insulation layer 80 have a plurality of through-holes exposing the charge storages 55a, 55b, and 55c.

The third organic photoelectric device 100c is formed on the upper insulation layer 80.

The third organic photoelectric device 100c includes a first electrode 10c and a second electrode 20c facing each other and a photoelectric conversion layer 30c between the first electrode 10c and the second electrode 20c.

The first electrode 10c, the second electrode 20c, and the photoelectric conversion layer 30c are the same as described above and the first and second photoelectric conversion layers 30c may selectively absorb light in one of red, blue, and green wavelength regions.

For example, the third organic photoelectric device 100c may be a green photoelectric device and the organic photoelectric device 100 may be applied.

In the drawing, the first electrode 10c, the photoelectric conversion layer 30c, and the second electrode 20c are sequentially stacked, but this disclosure is not limited thereto, and for example they may be stacked in an order of the second electrode 20c, the photoelectric conversion layer 30c, and the first electrode 10c.

Focusing lens (not shown) may be further formed on the organic photoelectric device 100c.

The focusing lens may control a direction of incident light and gather the light in one region.

The focusing lens may have a shape of, for example, a cylinder or a hemisphere, but is not limited thereto.

In the drawing, as the first organic photoelectric device 100a, the second organic photoelectric device 100b, and the third organic photoelectric device 100c, the organic photoelectric device of FIG. 1 is exemplified but the organic photoelectric device of FIG. 2 may be applied in the same manner.

In the drawing, the first organic photoelectric device 100a, the second organic photoelectric device 100b, and the third organic photoelectric device 100c are sequentially stacked, but the present disclosure is not limited thereto, and they may be stacked in various orders.

As described above, the first organic photoelectric device 100a, the second organic photoelectric device 100b, and the third organic photoelectric device 100c have a stack structure, and thus the size of an image sensor may be reduced to realize a down-sized image sensor.

The organic photoelectric device and the image sensor may be applied to various electronic devices, for example a mobile phone or a digital camera, but are not limited thereto.

Hereinafter, the example embodiments are illustrated in more detail with reference to examples. However, these examples are exemplary, and the present disclosure is not limited thereto.

SYNTHESIS EXAMPLE

Synthesis Example 1

[Chemical Formula A-1]

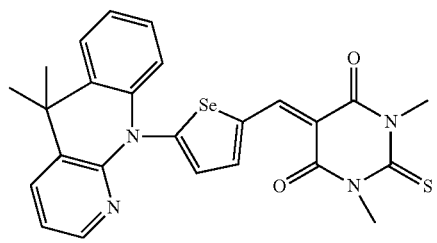

[Reaction Scheme 1]

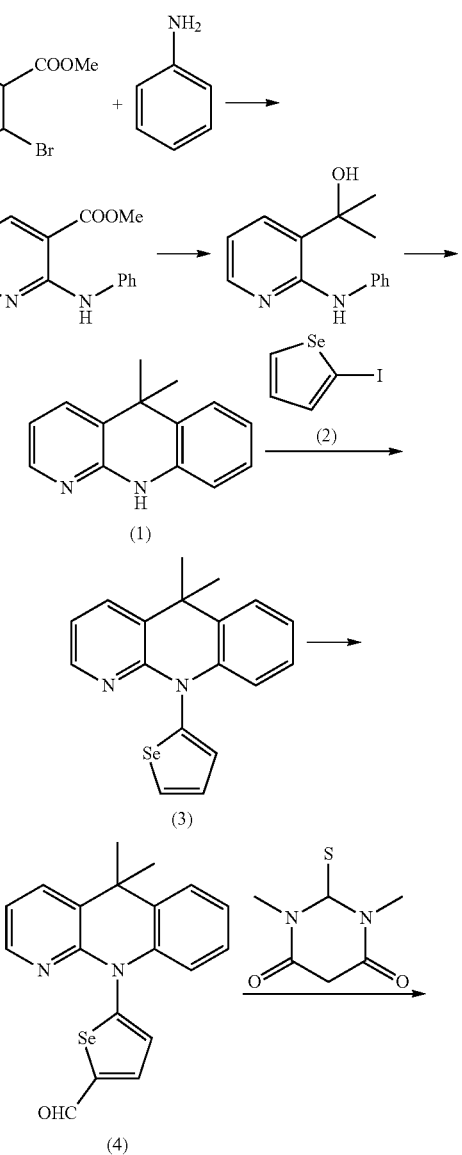

-continued

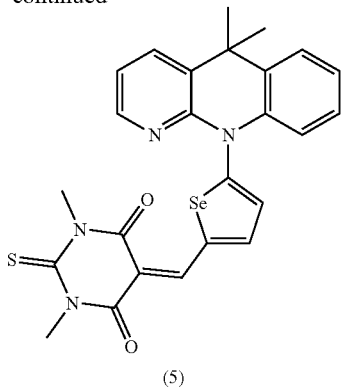

(5)

Synthesis of Compound (1)

Compound (1) is synthesized according to the method described in Heterocycles 2008, 75, 11, 2735-2744 and Pharmazie 198439 10, 671-2.

Synthesis of Compound (2)

2-iodoselenophene is synthesized in a method described in Efficient Synthesis of 2-Iodo and 2-Dicyanomethyl Derivatives of Thiophene, Selenophene, Tellurophene and Thieno[3,2-b]thiophene, Takahashi, K.; Tarutani, S. Heterocycles 1996, 43, 1927-1935.

Synthesis of Compound (3)

1 g (3.89 mmol) of 2-iodoselenophene and 0.74 g (3.54 mmol) of Compound (1) are heated and refluxed for 2 hours in 6 ml of anhydrous toluene under presence of 5 mol % of Pd(dba)$_2$, 5 mol % of P(tBu)$_3$, and 0.37 g (3.89 mmol) of NaOtBu. A product obtained therefrom was separated and purified through silica gel column chromatography (a volume ratio: toluene: hexane =1:4) to obtain 0.78 g of Compound (3) (Yield=65%).

Synthesis of Compound (4)

0.16 ml of phosphoryl chloride is added in a dropwise fashion to 0.5 ml of N,N-dimethylformamide at −15° C., and the mixture is stirred at room temperature (24° C.) for 2 hours. The resultant is slowly added in a dropwise fashion to 10 ml of dichloromethane and 0.46 g (1.54 mmol) of Compound 3 at −15° C., and the obtained mixture is stirred at room temperature for 30 minutes and concentrated under a reduced pressure. Subsequently, 5 ml of water was added thereto, a sodium hydroxide aqueous solution is added thereto until pH becomes 14, and the resulting mixture is stirred at room temperature (24° C.) for 2 hours. An organic layer extracted with ethyl acetate is washed with an aqueous sodium chloride solution and dried by adding anhydrous magnesium sulfate thereto. A product obtained therefrom is separated and purified through silica gel column chromatography (a volume ratio of hexane: dichloromethane=3:2) to obtain 0.48 g of Compound (4) (Yield: 85%).

Synthesis of Compound (5) represented by Chemical Formula 1-1

0.40 g (1.09 mmol) of Compound (4) is suspended in ethanol, 0.23 g (1.3 mmol) of 1,3-dimethyl-2-thiobarbituric acid synthesized according to a method described in J. Pharmacol, 1944, 82, 292, p. 4417 is added thereto, and the mixture is reacted at 50° C. for 2 hours to obtain 0.51 g of a compound represented by Chemical Formula 1-1 (Yield: 95%). The compound is sublimated and purified up to purity of 99.5%.

1HNMR ppm (CDCl3) 8.67(s)-1H, 8.59(dd)-1H, 8.18(d)-1H, 7.81(dd)-1H, 7.76(m)-1H, 7.55(m)-1H, 7.48(d)-1H, 7.22(m)-2H, 7.26(m)-1 H, 3.88(s)-3H, 3.83(s)-3H, 1.61(s)-6H.

Synthesis Example 2

[Chemical Formula A-2]

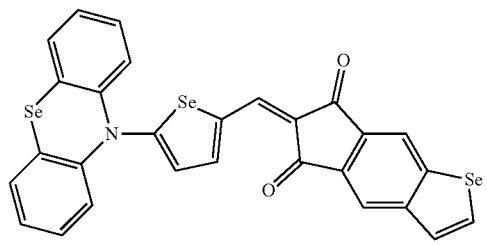

[Reaction Scheme 2]

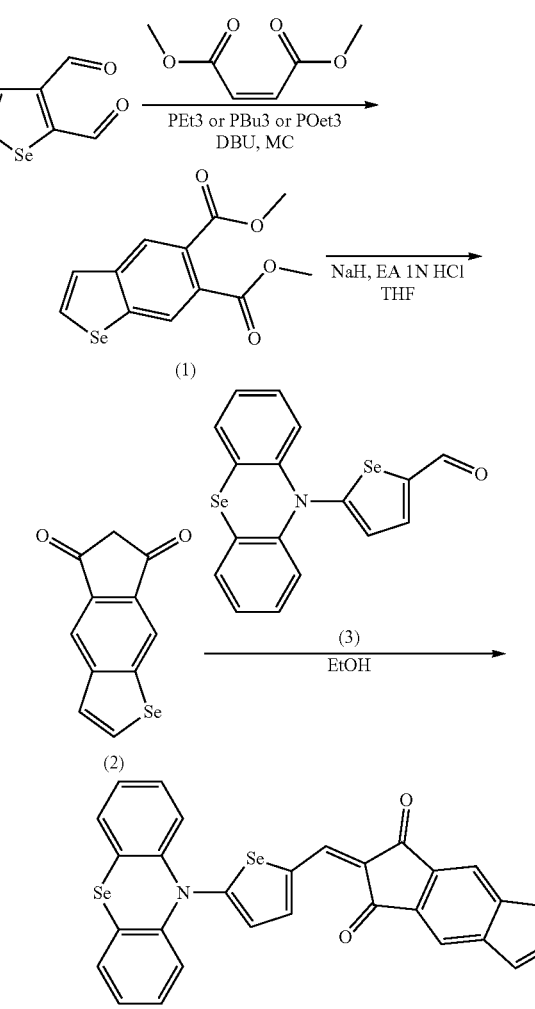

A-2

Synthesis of 2-Iodoselenophene 2-iodoselenophene is synthesized in a method described in Efficient Synthesis of 2-Iodo and 2-Dicyanomethyl Derivatives of Thiophene, Selenophene, Tellurophene and Thieno[3,2-b]thiophene, Takahashi, K.; Tarutani, S. Heterocycles 1996, 43, 1927-1935.

Synthesis of 10H-phenoselenazine 10H-phenoselenazine is purchased from Medigen Inc. (purity: 98% or greater).
Reference: Preparation and Some Reactions of Phenoxazine and Phenoselenazine, Paulette Muller, N. P. Buu-HOI, and R. RIPS, J. Org. Chem., 1959, 24 (1), pp 37-39 t

Synthesis of 10-(selenophen-2-yl)-10H-phenoselenazine 13.6 g (52.8 mmol) of 2-iodoselenophene and 10.0 g (40.6 mmol) of 10H-phenoselenazine are heated and refluxed for 2 hours at 120° C. in 100 ml of anhydrous toluene under presence of 5 mol % of Pd(dba)$_2$, 5 mol % of P(t-Bu)$_3$, and 4.29 g (44.7 mmol) of NaOtBu. A product obtained therefrom is separated and purified through silica gel column chromatography (a volume ratio of toluene:hexane=1:4) to obtain 6.89 g of 10-(selenophen-2-yl)-10H-phenoselenazine (Yield: 45.2%).

Synthesis of 5-(10H-phenoselenazin-10-yl)selenophene-2-carbaldehyde 2.2 ml of phosphoryl chloride is added in a dropwise fashion in 6.8 ml of N,N-dimethylformamide at −15° C., and the mixture is stirred at room temperature (24° C.) for 2 hours. The resultant is slowly added in a dropwise fashion to a mixture of 180 ml of dichloromethane and 6.84 g of 10-(selenophen-2-yl)-10H-phenoselenazine at −15° C., and the mixture is stirred at room temperature for 30 minutes and concentrated under a reduced pressure. Subsequently, 100 ml of water is added thereto, a sodium hydroxide aqueous solution is added thereto until pH becomes 14, and the obtained mixture is stirred at room temperature (24° C.) for 2 hours. An organic layer extracted with ethyl acetate is washed with a sodium chloride aqueous solution and dried with anhydrous magnesium sulfate. A product obtained therefrom is separated and purified through silica gel column chromatography (hexane:dichloromethane=3:2 volume ratio) to obtain 5.16 g of 5-(10H-phenoselenazin-10-yl)selenophene-2-carbaldehyde (Compound (3)) (Yield: 70%).

Synthesis of Compound A-2.

2.5 g (6.20 mmol) of 5-(10H-phenoselenazin-10-yl)selenophene-2-carbaldehyde and 2.00 g (8.06 mmol) of 5H-indeno[5,6-b]selenophene-5,7(6H)-dione are transferred to 250 ml of a round flask and 80 ml of ethanol is added and the resultant is stirred at 60° C. for 4 hours. Subsequently, the resultant is cooled down to room temperature, 150 ml of n-hexane is added thereto, and the obtained mixture is stirred for 30 minutes. Next, a resultant therefrom is washed with n-hexane to obtain a crude product. Subsequently, the crude product is moved into a 2 L triangular flask, 450 ml of chloroform is added thereto, and the obtained mixture is heated at 70° C. stirred to dissolve the product. Then, 700 ml of n-hexane is slowly added thereto drop by drop, and the obtained mixture is cooled down to room temperature and filtered to obtain a product. The precipitation and purification are repeated up to purity of 99.9%. When the purification is complete, a product therefrom is vacuum-dried at 150° C. for 2 hours to remove residual hexane to obtain 3.02 g of (Z)-6-((5-(10H-phenoselenazin-10-yl)selenophen-2-yl)methylene)-5H-indeno[5,6-b]selenophene-5,7(6H)-dione (Compound A-2). Or, the product may be baked during the sublimation purification at 150° C. for greater than or equal to 2 hours.

A yield is 83%.
Evaluation I

Thermal properties of compounds according to Synthesis Examples 1 and 2 are evaluated.

The thermal properties is evaluated by increasing a temperature at 10 Pa pressure and measuring 10 wt % loss temperature ($T_{s10}$) and 50 wt % loss temperature ($T_{s50}$) of each sample.

The loss temperature is measured by a thermal gravimetric analysis (TGA) (TG-DTA2000SE/Netzsch Japan).
The results are shown in Table 1.

TABLE 1

| | Tm (° C.) | $T_{s10}$ (° C.) | $T_{s50}$ (° C.) | $(T_m - T_{s10},$ ° C.) | $(T_m - T_{s50},$ ° C.) |
|---|---|---|---|---|---|
| Synthesis Example 1 | 310 | 243 | 267 | 67 | 43 |
| Synthesis Example 2 | 370 | 288 | 321 | 82 | 49 |

Evaluation II

After the compounds according to Synthesis Examples 1 and 2 are heated at a temperature around $T_{s50}$ (actual test temperature: Isothermal temperature) for 8 hours and a weight loss of each sample is measured.

The weight loss is measured by a thermogravimetric analysis (TGA) method.

The results are shown in Table 2.

TABLE 2

| | Tm (° C.) | $T_{s50}$ (° C.) | Isothermal temperature (° C.) | Weight loss (ΔTG) (%) |
|---|---|---|---|---|
| Synthesis Example 1 | 310 | 267 | 260 | 27.2 |
| Synthesis Example 2 | 370 | 321 | 320 | 10.8 |

In Table 2, as the weight loss (ΔTG) is smaller, the material has higher heat resistance.
Manufacture of Organic Photoelectric Device

Example 1

A 150 nm-thick anode is formed by sputtering ITO on a glass substrate and a photoelectric conversion layer is formed by codepositing the compound according to Synthesis Example 1 (first p-type semiconductor), the compound according to Synthesis Example 2 (second p-type semiconductor), and C60(n-type semiconductor) in a volume ratio of 0.9:0.9:1 thereon. The codepositing is performed at a pressure of 3.5'10$^{-7}$ Torr pressure for 35 minutes, and when the codepositing is completed, a temperature of a cell for the first p-type semiconductor is 231° C. and a temperature of a cell for the second p-type semiconductor is 290° C. Subsequently, a 10 nm-thick molybdenum oxide (MoOx, 0<x≤3)

thin film is stacked as a charge auxiliary layer on the photoelectric conversion layer and ITO is stacked by sputtering to form a 7 nm-thick cathode, manufacturing an organic photoelectric device.

Example 2

An organic photoelectric device is manufactured according to the same method as Example 1, except for continuously twice codepositing the compound according to Synthesis Example 1 (first p-type semiconductor), the compound according to Synthesis Example 2 (second p-type semiconductor) and C60 (n-type semiconductor). Herein, the first codepositing is performed at a pressure of 3.5×10-7 Torr for 35 minutes, when the codepositing is completed, a temperature of a cell for the first p-type semiconductor is 231° C. and a temperature of a cell for the second p-type semiconductor is 290° C., and the second codepositing is performed at a pressure of 3.5×10-7 Torr for 35 minutes, and when the codepositing is completed, a temperature of a cell for the first p-type semiconductor is 231° C. and a temperature of a cell for the second p-type semiconductor is 291° C. (total 70 minutes).

Example 3

An organic photoelectric device is manufactured according to the same method as Example 1, except for continuously three times codepositing the compound according to Synthesis Example 1 (first p-type semiconductor), the compound according to Synthesis Example 2 (second p-type semiconductor) and C60 (n-type semiconductor). Herein, the first codepositing is performed at a pressure of $3.5\times10^{-7}$ Torr for 35 minutes, and when the codepositing is completed, a temperature of a cell for the first p-type semiconductor is 231° C. and a temperature of a cell for the second p-type semiconductor is 290° C., the second codepositing is performed at a pressure of $3.5\times10^{-7}$ Torr for 35 minutes, and when the codepositing is completed, a temperature of a cell for the first p-type semiconductor is 231° C. and a temperature of a cell for the second p-type semiconductor is 291° C., and the third codepositing is performed at a pressure of $2.2\times10^{-6}$ Torr for 35 minutes, and when the codepositing is completed, a temperature of a cell for the first p-type semiconductor is 232° C. and a temperature of a cell for the second p-type semiconductor is 291° C. (total 105 minutes).

Example 4

An organic photoelectric device is manufactured according to the same method as Example 1, except for continuously four times codepositing the compound according to Synthesis Example 1 (first p-type semiconductor), the compound according to Synthesis Example 2 (second p-type semiconductor) and C60 (n-type semiconductor). Herein, the first codepositing is performed at a pressure of $3.5\times10^{-7}$ Torr for 35 minutes, and when the codepositing is completed, a temperature of a cell for the first p-type semiconductor is 231° C. and a temperature of a cell for the second p-type semiconductor is 290° C., the second codepositing is performed at a pressure of $3.5\times10^{-7}$ Torr for 35 minutes, and when the codepositing is completed, a temperature of a cell for the first p-type semiconductor is 231° C. and a temperature of a cell for the second p-type semiconductor is 291° C., the third codepositing is performed at a pressure of $2.2\times10^{-6}$ Torr for 35 minutes, and when the codepositing is completed, a temperature of a cell for the first p-type semiconductor is 232° C. and a temperature of a cell for the second p-type semiconductor is 291° C., and the fourth codepositing is performed at a pressure of $1.5\times10^{-5}$ Torr for 35 minutes, and when the codepositing is completed, a temperature of a cell for the first p-type semiconductor is 237° C. and a temperature of a cell for the second p-type semiconductor is 291° C. (total 140 minutes).

Example 5

An organic photoelectric device is manufactured according to the same method as Example 1, except for continuously five times codepositing the compound according to Synthesis Example 1 (first p-type semiconductor), the compound according to Synthesis Example 2 (second p-type semiconductor) and C60 (n-type semiconductor). Herein, the first codepositing is performed at a pressure of $3.5\times10^{-7}$ Torr for 35 minutes, and when the codepositing is completed, a temperature of a cell for the first p-type semiconductor is 231° C. and a temperature of a cell for the second p-type semiconductor is 290° C., the second codepositing is performed at a pressure of $3.5\times10^{-7}$ Torr for 35 minutes, and when the codepositing is completed, a temperature of a cell for the first p-type semiconductor is 231° C. and a temperature of a cell for the second p-type semiconductor is 291° C., the third codepositing is performed at a pressure of $2.2\times10^{-6}$ Torr for 35 minutes, and when the codepositing is completed, a temperature of a cell for the first p-type semiconductor is 232° C. and a temperature of a cell for the second p-type semiconductor is 291° C., the fourth codepositing is performed at a pressure of $1.5\times10^{-5}$ Torr for 35 minutes, and when the codepositing is completed, a temperature of a cell for the first p-type semiconductor is 237° C. and a temperature of a cell for the second p-type semiconductor is 291° C., and fifth codepositing is performed at a pressure of $2.4\times10^{-5}$ Torr for 35 minutes, and when the codepositing is completed, a temperature of a cell for the first p-type semiconductor is 246° C. and a temperature of a cell for the second p-type semiconductor is 294° C. (total 175 minutes).

Comparative Example 1

An organic photoelectric device is manufactured according to the same method as Example 1, except for codepositing the compound according to Synthesis Example 1 and C60 (1.8:1 v/v) at a pressure of $5.2\times10^{-7}$ Torr for 35 minutes to form a photoelectric conversion layer. Herein, the codepositing is performed at a pressure of $5.2\times10^{-7}$ Torr for 35 minutes and when the codepositing is completed, a temperature of a cell for the first p-type semiconductor is 242° C.

Comparative Example 2

An organic photoelectric device is manufactured according to the same method as Comparative Example 1, except for continuously twice codepositing the compound according to Synthesis Example 1 and C60. Herein, the first codepositing is performed at a pressure of $5.2\times10^{-7}$ Torr for 35 minutes and when the codepositing is completed, a temperature of a cell for the first p-type semiconductor is 242° C., and the second codepositing is performed at a pressure of $8.7\times10^{-6}$ Torr for 35 minutes and when the codepositing is completed, a temperature of a cell for the first p-type semiconductor is 250° C. (total 70 minutes).

Comparative Example 3

An organic photoelectric device is manufactured according to the same method as Comparative Example 1, except for continuously three times codepositing the compound according to Synthesis Example 1 and C60. Herein, the first codepositing is performed at a pressure of $5.2 \times 10^{-7}$ Torr for 35 minutes and when the codepositing is completed, a temperature of a cell for the first p-type semiconductor is 242° C., the second codepositing is performed at a pressure of $8.7 \times 10^{-6}$ Torr for 35 minutes and when the codepositing is completed, a temperature of a cell for the first p-type semiconductor is 250° C., and the third codepositing is performed at a pressure of $2.3 \times 10^{-5}$ Torr for 35 minutes and when the codepositing is completed, a temperature of a cell for the first p-type semiconductor is 276° C.

Evaluation III

Compound purities and impurity contents of the photoelectric conversion layers of the organic photoelectric devices according to Examples 1 to 5 and Comparative Examples 1 to 3 are evaluated.

The compound purities and impurity are evaluated using UPLC (Ultra Performace Liquid Chromatography).

Figure 8:
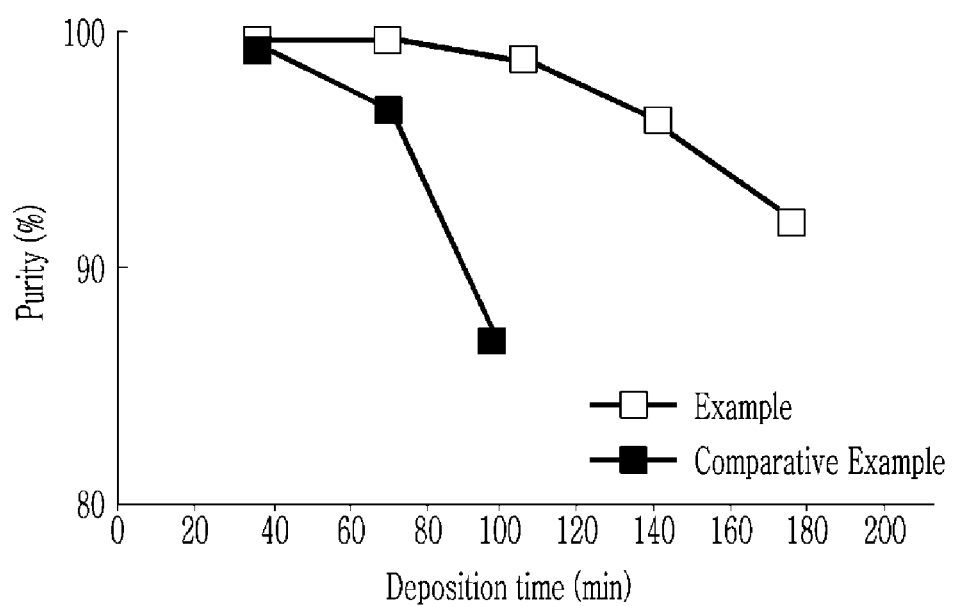
FIG. 8 is a graph showing purity changes of the photoelectric conversion layers during continuous deposition in the organic photoelectric devices according to Examples and Comparative Examples.
Figure 9:
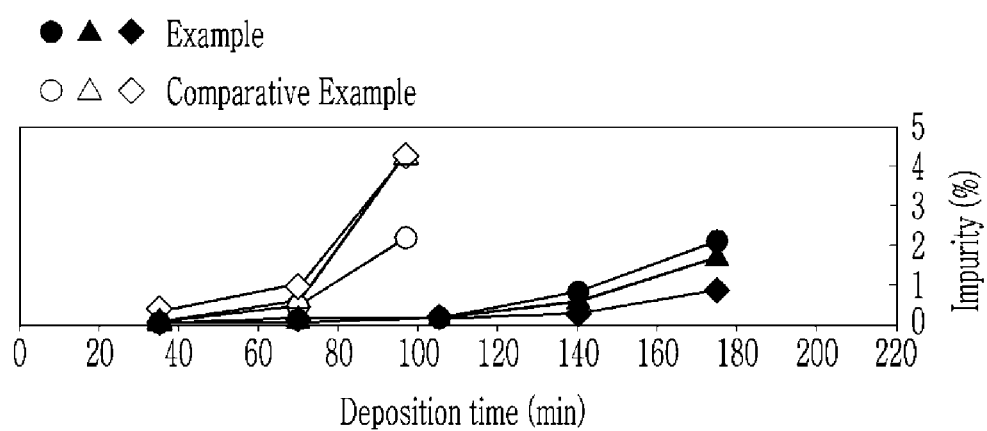
FIG. 9 is a graph showing impurity production ratios of the photoelectric conversion layers during continuous deposition in the organic photoelectric devices according to Examples and Comparative Examples.

The results are shown in Table 3 and FIGS. 8 and 9.

FIG. 8 is a graph showing purity changes of the photoelectric conversion layers during continuous deposition in the organic photoelectric devices according to Examples and Comparative Examples and FIG. 9 is a graph showing impurity production ratios of the photoelectric conversion layers during continuous deposition in the organic photoelectric devices according to Examples and Comparative Examples.

TABLE 3

| | Deposition number | Deposition time (min) | Purity (%) | Impurity (%) | | |
|---|---|---|---|---|---|---|
| | | | | A | B | C |
| Example 1 | 1 | 35 | 99.69 | 0.07 | 0.03 | 0.13 |
| Example 2 | 2 | 70 | 99.66 | 0.04 | 0.02 | 0.15 |
| Example 3 | 3 | 105 | 98.82 | 0.16 | 0.18 | 0.19 |
| Example 4 | 4 | 140 | 96.24 | 0.84 | 0.62 | 0.31 |
| Example 5 | 5 | 175 | 91.95 | 2.16 | 1.72 | 0.88 |
| Comparative Example 1 | 1 | 35 | 99.50 | 0.06 | — | 0.42 |
| Comparative Example 2 | 2 | 70 | 96.69 | 0.50 | 0.63 | 0.95 |
| Comparative Example 3 | 3 | 97 | 86.93 | 2.20 | 4.25 | 4.27 |

Referring to Table 3 and FIG. 8, the organic photoelectric device according to Examples exhibit relatively small purity changes depending on a deposition time of the photoelectric conversion materials and maintain purities of greater than or equal to about 90% after five times continuous depositionion for about 175 minutes.

On the contrary, the organic photoelectric device according to Comparative Examples exhibit large purity changes depending on a deposition time of the photoelectric conversion materials and purity of less than 90% after three times continuous depositionion within about 100 minutes.

Referring to Table 3 and FIG. 9, the organic photoelectric device according to Examples exhibit low impurity production rates according to continuous depositionion of the photoelectric conversion materials but the organic photoelectric device according to Comparative Examples exhibit significantly high impurity production rates according to continuous depositionion of the photoelectric conversion materials.

Herein the impurity is a material produced by thermal decomposition of the photoelectric conversion material and the organic photoelectric devices according to Comparative Examples are thermally decomposed at a lower temperature rapidly.

From the results, the organic photoelectric devices according to Examples have higher thermal stability compared with the organic photoelectric devices according to Comparative Examples.

Evaluation IV

Changes of the external quantum efficiency of the photoelectric devices according to Example 1 and Comparative Examples 1 and 2 are evaluated.

The external quantum efficiency (EQE) is measured by using an IPCE measurement system (McScience Inc., Korea).

The EQE is measured at a wavelength ranging from about 350 nm to about 750 nm by calibrating IPCE measurement system with the Si photodiode (Hamamatsu Photonics K.K., Japan) and mounting the photoelectric devices according to Examples 1 to 6.

Figure 10:
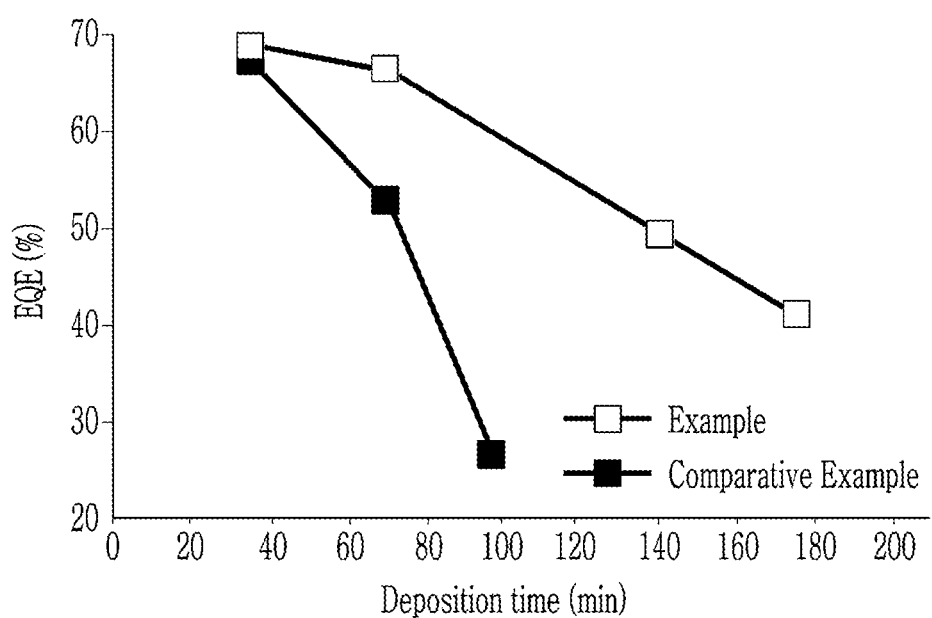
FIG. 10 is a graph showing changes of external quantum efficiency during continuous deposition in the organic photoelectric devices according to Examples and Comparative Examples.

The results are shown in Table 4 and FIG. 10.

FIG. 10 is a graph showing changes of external quantum efficiency during continuous deposition in the organic photoelectric devices according to Examples and Comparative Examples.

TABLE 4

| | Deposition number | Deposition time (min) | $EQE_{\lambda max}$ (%) |
|---|---|---|---|
| Example 1 | 1 | 35 | 68.3 |
| Example 2 | 2 | 70 | 66.8 |
| Example 3 | 3 | 105 | 58.2 |
| Example 4 | 4 | 140 | 49.5 |
| Example 5 | 5 | 175 | 41.4 |
| Comparative Example 1 | 1 | 35 | 67.7 |
| Comparative Example 2 | 2 | 70 | 52.9 |
| Comparative Example 3 | 3 | 97 | 26.7 |

Referring to Table 4 and FIG. 10, the organic photoelectric devices according to Examples exhibit gradual changes of the external quantum efficiency in accordance with the continuous deposition of photoelectric conversion material while the organic photoelectric devices according to Comparative Examples exhibit large changes of the external quantum efficiency in accordance with the continuous deposition of photoelectric conversion material.

Evaluation V

Characteristics of the organic photoelectric devices according to Example 1 and Comparative Examples 1 and 2 are evaluated.

Figure 11:
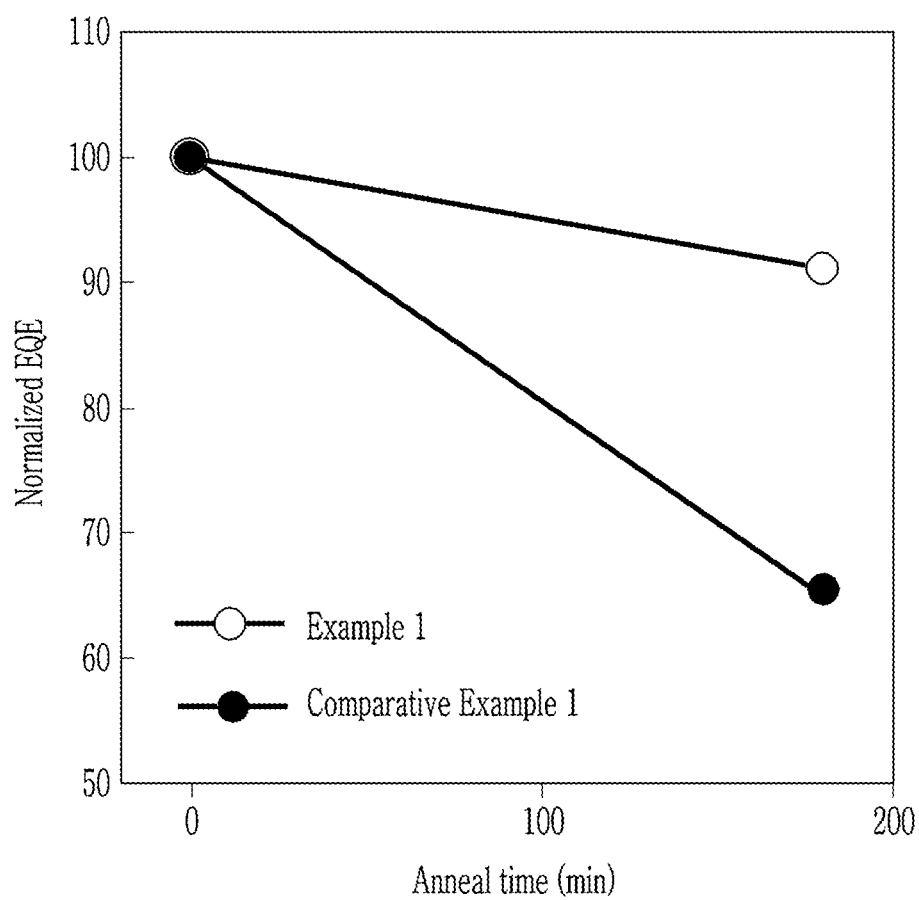
FIG. 11 is a graph showing changes of external quantum efficiency after placing the organic photoelectric devices of Example 1 and Comparative Example 1 at 170° C. for 180 minutes.

The results are shown in Table 5 and FIG. 11.

FIG. 11 is a graph showing normalized changes of external quantum efficiency after placing the organic photoelectric devices of Example 1 and Comparative Example 1 at 170° C. for 3 hour (180 minutes).

TABLE 5

| | $\lambda_{max}$ | FWHM (nm) | $EQE_{\lambda max}$ (%) (@3 V) | $EQE_{450\,nm}$ (%) | $EQE_{\lambda max}$(%) (@3 V) (170° C., 3 h) |
|---|---|---|---|---|---|
| Example 1 | 545 | 116.1 | 68.3 | 22.0 | 63.9 |
| Comparative Example 1 | 545 | 108.5 | 67.7 | 18.3 | 44.4 |
| Comparative Example 2 | 540 | 119.9 | 67.0 | 29.1 | 66.4 |

Referring to Table 5 and FIG. 11, the organic photoelectric device according to Example 1 exhibits a small change of the external quantum efficiency after placing it at a higher temperature compared with the organic photoelectric device according to Comparative Example 1 and the organic photoelectric device according to Example 1 exhibits higher wavelength selectivity in a green wavelength region compared with the organic photoelectric device according to Comparative Example 2.

While this disclosure has been described in connection with what is presently considered to be practical example embodiments, it is to be understood that the invention is not limited to the disclosed example embodiments, but, on the contrary, is intended to cover various modifications and equivalent arrangements included within the spirit and scope of the appended claims.

What is claimed is:

1. An organic photoelectric device, comprising
a first electrode and a second electrode facing each other, and
a photoelectric conversion layer between the first electrode and the second electrode, the photoelectric conversion layer selectively absorbing light in a green wavelength region
wherein the photoelectric conversion layer includes first and second photoelectric conversion materials,
a light-absorption full width at half maximum (FWHM) in a green wavelength region of the first photoelectric conversion material is narrower than the light-absorption FWHM in a green wavelength region of the second photoelectric conversion material, and
the first and second photoelectric conversion materials satisfy Relationship Equation 1:

$$Tm_2(°C.) - Ts_{2(10)}(°C.) \geq Tm_1(°C.) - Ts_{1(10)}(°C.) \quad \text{[Relationship Equation 1]}$$

wherein, in Relationship Equation 1,
$Tm_1$ is a melting point of the first photoelectric conversion material,
$Tm_2$ is a melting point of the second photoelectric conversion material,
$Ts_{1(10)}$ is a temperature where 10 wt % weight loss occurs due to sublimation of the first photoelectric conversion material at 10 Pa, and
$Ts_{2(10)}$ is a temperature where 10 wt % weight loss occurs due to sublimation of the second photoelectric conversion material at 10 Pa.

2. The organic photoelectric device of claim 1, wherein the second photoelectric conversion material satisfies Relationship Equation 1a:

$$Tm_2(°C.) - Ts_{2(10)}(°C.) \geq 75°C. \quad \text{[Relationship Equation 1a]}$$

wherein, in Relationship Equation 1a,
$Tm_2$ is a melting point of the second photoelectric conversion material, and
$Ts_{2(10)}$ is a temperature where 10 wt % weight loss occurs due to sublimation of the second photoelectric conversion material at 10 Pa.

3. The organic photoelectric device of claim 2, wherein the first photoelectric conversion material satisfies Relationship Equation 1b:

$$Tm_1(°C.) - Ts_{1(10)}(°C.) < 75°C. \quad \text{[Relationship Equation 1b]}$$

wherein, in Relationship Equation 1b,
$T_{m1}$ is a melting point of the first photoelectric conversion material, and
$T_{s1\ 10}$ is a temperature where 10 wt % weight loss occurs due to sublimation of the first photoelectric conversion material at 10 Pa.

4. The organic photoelectric device of claim 1, wherein the first and second photoelectric conversion materials satisfies Relationship Equation 2:

$$Tm_2(°C.) - Ts_{2(50)}(°C.) \geq Tm_1(°C.) - Ts_{1(50)}(°C.) \quad \text{[Relationship Equation 2]}$$

wherein, in Relationship Equation 2,
$T_m i$ is a melting point of the first photoelectric conversion material,
$T_{m2}$ is a melting point of the second photoelectric conversion material,
$T_{s1(50)}$ ) is a temperature where 50 wt % weight loss occurs due to sublimation of the first photoelectric conversion material at 10 Pa, and
$T_{s2(50)}$ is a temperature where 50 wt % weight loss occurs due to sublimation of the second photoelectric conversion material at 10 Pa.

5. The organic photoelectric device of claim 4, wherein the second photoelectric conversion material satisfies Relationship Equation 2a:

$$Tm_2(°C.) - Ts_{2(50)}(°C.) \geq 48°C. \quad \text{[Relationship Equation 2a]}$$

wherein, in Relationship Equation 2a,
$T_{m2}$ is a melting point of the second photoelectric conversion material, and
$T_{s2(50)}$ is a temperature where 50 wt % weight loss occurs due to sublimation of the second photoelectric conversion material at 10 Pa.

6. The organic photoelectric device of claim 5, wherein the first photoelectric conversion material satisfies Relationship Equation 2b:

$$Tm_1(°C.) - Ts_{1(50)}(°C.) \leq 45°C. \quad \text{[Relationship Equation 2b]}$$

wherein, in Relationship Equation 2b,
$T_{m1}$ i is a melting point of the first photoelectric conversion material, and
$T_{s1(50)}$ is a temperature where 50 wt % weight loss occurs due to sublimation of the first photoelectric conversion material at 10 Pa.

7. The organic photoelectric device of claim 1, wherein the light-absorption full width at half maximum (FWHM) in a green wavelength region of the first photoelectric conversion material is less than or equal to about 110 nm.

8. The organic photoelectric device of claim 1, wherein external quantum efficiency in a 450 nm wavelength of the first photoelectric conversion material is lower than external quantum efficiency in a 450 nm wavelength of the second photoelectric conversion material.

9. The organic photoelectric device of claim 1, wherein the first and second photoelectric conversion materials have each peak absorption wavelength ($\lambda_{max}$) in a region of about 530 nm to about 570 nm.

10. The organic photoelectric device of claim 1, wherein the first and second photoelectric conversion materials are independently represented by Chemical Formula 1:

EDG-HA-EAG [Chemical Formula 1]

wherein, in Chemical Formula 1,
HA is a C2 to C30 heterocyclic group including at least one of Se, Te, S, and Si,
EDG is an electron donating group, and
EAG is an electron accepting group.

11. The organic photoelectric device of claim 10, wherein the second photoelectric conversion material represented by the Chemical Formula 1 is represented by Chemical Formula 1b:

[Chemical Formula 1b]

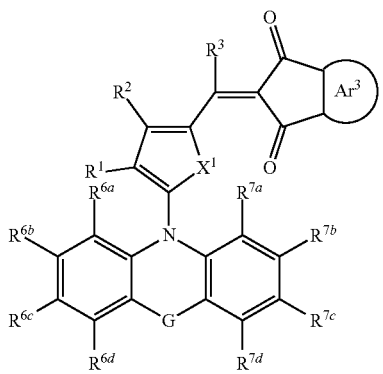

wherein, in Chemical Formula 1b, $X^1$ is Se, Te, O, S, SO, or SO2, $Ar^3$ is a substituted or unsubstituted C6 to C30 arylene group, a substituted or unsubstituted C3 to C30 heterocyclic group, or a fused ring of the foregoing two or more, $R^1$ to $R^3$ are independently one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, and a combination thereof, G is one of a single bond, —O—, —S—, —Se—, —N=, —(CR$^f$R$^g$)$_k$—, —NR$^h$—, —GeR$^k$R$^l$—, —(C(R$^m$)=C(R$^n$))—, and SnR$^o$R$^p$, wherein R$^f$, R$^g$, R$^h$, R$^i$, R$^j$, R$^k$, R$^m$, R$^o$, and R$^p$ are independently one of hydrogen, a halogen, a substituted or unsubstituted C1 to C10 alkyl group, a substituted or unsubstituted C1 to C10 alkoxy group, and a substituted or unsubstituted C6 to C12 aryl group, R$^f$ and R$^g$, R$^i$ and R$^j$, R$^k$ and R$^l$, R$^m$ and R$^n$, and R$^o$ and R$^p$ are independently present alone or linked with each other to provide a ring, and k is 1 or 2, $R^{6a}$ to $R^{6d}$ and $R^{7a}$ to $R^{7d}$ are independently one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, and a combination thereof, $R^{6a}$ to $R^{6d}$ are independently present alone or adjacent two thereof are linked with each other to form a fused ring, and $R^{7a}$ to $R^{7d}$ are independently present alone or adjacent two thereof are linked with each other to form a fused ring.

12. The organic photoelectric device of claim 11, wherein $Ar^3$ of Chemical Formula 1b is benzene, naphthylene, anthracene, thiophene, selenophene, tellurophene, pyridine, pyrimidine, or a fused ring of the foregoing two or more.

13. The organic photoelectric device of claim 1, wherein the first and second photoelectric conversion materials are included in a weight ratio of about 50:50 to about 95:5.

14. The organic photoelectric device of claim 1, wherein the photoelectric conversion layer includes at least one p-type semiconductor and at least one n-type semiconductor to form a pn junction, and
each of the first and second photoelectric conversion material is the p-type semiconductor.

15. The organic photoelectric device of claim 14, wherein the n-type semiconductor includes fullerene or a fullerene derivative.

16. An image sensor comprising the organic photoelectric device of claim 1.

17. The image sensor of claim 16, further comprising a semiconductor substrate under the organic photoelectric device, and
the semiconductor substrate includes
a first photo-sensing device configured to sense light in a red wavelength region, and
a second photo-sensing device configured to sense light in a blue wavelength region.

18. The image sensor of claim 16, wherein the organic photoelectric device is a first organic photoelectric device, the image sensor further comprising:
a second organic photoelectric device configured to sense light in a red wavelength region, and
a third organic photoelectric device configured to sense light in a blue wavelength region.

19. An electronic device comprising the image sensor of claim 16.

20. An electronic device comprising the organic photoelectric device of claim 1.

* * * * *